United States Patent
Kim et al.

(10) Patent No.: US 6,795,372 B2
(45) Date of Patent: Sep. 21, 2004

(54) BIT LINE SENSE AMPLIFIER DRIVING CONTROL CIRCUITS AND METHODS FOR SYNCHRONOUS DRAMS THAT SELECTIVELY SUPPLY AND SUSPEND SUPPLY OF OPERATING VOLTAGES

(75) Inventors: Myeong-o Kim, Seoul (KR); Chi-wook Kim, Kyungki-do (KR); Sung-min Seo, Kyungki-do (KR)

(73) Assignee: Samsung Electronics Co. Ltd. (KR)

( * ) Notice: Subject to any disclaimer, the term of this patent is extended or adjusted under 35 U.S.C. 154(b) by 0 days.

(21) Appl. No.: 10/389,482

(22) Filed: Mar. 14, 2003

(65) Prior Publication Data

US 2004/0047215 A1 Mar. 11, 2004

(30) Foreign Application Priority Data

Sep. 11, 2002 (KR) .................... 10-2002-0055001

(51) Int. Cl.[7] .............................. G11C 8/00; G11C 7/00
(52) U.S. Cl. ................. 365/233; 365/230.03; 365/207; 365/194
(58) Field of Search ........................... 365/233, 230.03, 365/230.06, 226, 227, 207, 63, 194

(56) References Cited

U.S. PATENT DOCUMENTS

| | | | | |
|---|---|---|---|---|
| 5,535,169 A | * | 7/1996 | Endo et al. .................. | 365/233 |
| 5,831,924 A | * | 11/1998 | Nitta et al. .................. | 365/233 |
| 6,256,258 B1 | * | 7/2001 | Tsuchida et al. ............. | 365/233 |
| 6,310,815 B1 | * | 10/2001 | Yamagata et al. ............ | 365/63 |
| 6,345,007 B1 | * | 2/2002 | Kim ........................... | 365/233 |
| 6,646,946 B2 | * | 11/2003 | Tomishima et al. .......... | 365/63 |
| 6,665,203 B2 | * | 12/2003 | Fujisawa et al. ............. | 365/63 |
| 6,665,222 B2 | * | 12/2003 | Wright et al. ............... | 365/233 |

* cited by examiner

*Primary Examiner*—Trong Phan
(74) *Attorney, Agent, or Firm*—Myers Bigel Sibley & Sajovec

(57) ABSTRACT

Bit line sense amplifier driving control circuits and methods for synchronous DRAMs selectively supply and suspend supply of operating voltages for bit line sense amplifiers. More specifically, a synchronous DRAM includes a memory cell array including at least a first column block and a second column block that are divided according to column address, first bit line sense amplifiers that are configured to sense data that is output from the first column block of the memory cell array, and second bit line sense amplifiers that are configured to sense data that is output from the second column block of the memory cell array. A bit line sense amplifier driving control circuit or method is responsive to a row address select signal, to supply an operating voltage to the first and second bit line sense amplifiers, and is responsive to a column select signal that selects a column address in the first column block, to suspend supplying an operating voltage to the second bit line sense amplifiers.

27 Claims, 11 Drawing Sheets

BIT LINE SENSE AMPLIFIER DRIVING CONTROL CIRCUITS AND METHODS FOR SYNCHRONOUS DRAMS THAT SELECTIVELY SUPPLY AND SUSPEND SUPPLY OF OPERATING VOLTAGES

RELATED APPLICATION

This application claims the benefit of Korean Patent Application No. 2002-55001, filed Sep. 11, 2002, the disclosure of which is hereby incorporated herein by reference in its entirety as if set forth fully herein.

FIELD OF THE INVENTION

The present invention relates to synchronous Dynamic Random Access Memories (DRAM), and more particularly, to a bit line sense amplifier driving control circuits and methods for synchronous DRAMs.

BACKGROUND OF THE INVENTION

Clocked DRAMs, also referred to as synchronous DRAMs, are widely used integrated circuit memory devices. According to a general data accessing method for a synchronous DRAM, a row address and a column address are sequentially input to a memory cell array with a time interval therebetween, to read or write data from or to the memory cell. The time interval from the row address input to the column address input should be long enough to allow correct recognition of the input row address so that valid data can be retrieved from the memory cell.

Since the synchronous DRAM operates in synchronization with a clock, a point of time when the row address or the column address is input is determined according to the clock cycle. A shorter clock cycle may speed up the synchronous DRAM, but may allow a shorter time lapse between the row address input and the column address input, and thus it may lead to an erroneous recognition of the row address.

FIG. 1 is a circuit diagram showing an example of a conventional bit line sense amplifier driving control circuit for a synchronous DRAM. Referring to FIG. 1, the conventional bit line sense amplifier driving control circuit includes a bit line sense amplifier controller 10 and a bit line sense amplifier driver 20.

The bit line sense amplifier controller 10 includes a first control circuit 11 and a second control circuit 12. The first control circuit 11 outputs an N sense amplifier control signal NSA_CTL for providing a first operating voltage to the NMOS transistors (not shown) of a bit line sense amplifier. The second control circuit 12 outputs a P sense amplifier control signal PSA_CTL for providing a second operating voltage to the PMOS transistors (not shown) of the bit line sense amplifier.

The first control circuit 11 includes a NAND gate 13 and an inverter 14. The NAND gate 13 performs a NAND-operation on a sensing start signal SA_SE_ST of the bit line sense amplifier and a row block information signal RA according to a row address input to output a predetermined control signal CTL. The inverter 14 inverts the control signal CTL to output the N sense amplifier control signal NSA_CTL.

The second control circuit 12 includes a first inverter 15 and a second inverter 16. The first inverter 15 inverts the control signal CTL. The second inverter 16 inverts an output signal of the first inverter 15 to output the P sense amplifier control signal PSA_CTL.

The bit line sense amplifier driver 20 is arranged in a column direction along a plurality of memory cell arrays 30. The bit line sense amplifier driver 20 includes a P sense amplifier driver circuit 21 and an N sense amplifier driver circuit 22. The P sense amplifier driver circuit 21 is a circuit to provide the second operating voltage to the PMOS transistors of the bit line sense amplifier. The N sense amplifier driver circuit 22 is a circuit to provide the first operating voltage to the NMOS transistors of the bit line sense amplifier.

The P sense amplifier driver circuit 21 includes a plurality of PMOS transistors 23 and the N sense amplifier driver circuit 22 includes a plurality of NMOS transistors 24. Each drain of the PMOS transistors 23 is connected to a local array line LA, and each source of the PMOS transistors 23 is connected to an internal voltage VCC. Each gate of the PMOS transistors 23 receives the P sense amplifier control signal PSA_CTL. As the plurality of PMOS transistors 23 are turned on by the P sense amplifier control signal PSA_CTL, the local array line LA transitions to a voltage level equal to the internal voltage VCC.

Each drain of the NMOS transistors 24 is connected to a local array bar line LAB, and each source of the NMOS transistors 24 is connected to ground. Each gate of the NMOS transistors 24 receives the N sense amplifier control signal NSA_CTL. As the plurality of NMOS transistor 24 is turned on by the N sense amplifier control signal NSA_CTL, the local array bar line LAB transitions to a ground voltage level.

The operation of the conventional bit line sense amplifier driving control circuit having the above-described configuration will be described with reference to FIG. 2.

FIG. 2 is a timing diagram of input/output signals involved in the bit line sense amplifier driving control circuit shown in FIG. 1. Referring to FIG. 2, when a control command ACTIVE is input in synchronization with a clock signal CLK and a row address is input, the row block information signal RA is enabled to activate a corresponding word line WL.

When the word line WL is activated, cell transistors in the memory cell arrays 30 connected to the word line WL are turned on, and data stored in cell capacitors are transmitted to bit lines. At this time, since the cell capacitors share charges with the bit lines, the initial voltage (reference voltage) level of the bit lines before the data are received is slightly changed into data voltage.

When the bit line sense amplifier sensing start signal SA_SE_ST is enabled, the P and N amplifier control signals PSA_CTL and NSA_CM are enabled to turn on the PMOS and NMOS transistors 23 and 24. As discussed above with reference to FIG. 1, and as shown in FIG. 2, as the plurality of PMOS transistors 23 and the plurality of NMOS tansistors 24 are turned on by the respective signals PSA_CTL and NSA–CLT, the local array line LA and the local array bar line LAB transition to VCC and ground voltage, respectively. When the PMOS ants NMOS transistors 23 and 24 are turned on, first and second operating voltages are applied to the bit line sense amplifier, and the data voltage of the bit line is primarily amplified by the bit line sense amplifiers.

When a read command READ and a column address are input, a column select signal CSL is generated, the data voltage of the bit line is secondarily amplified while passing through a column path, and the amplified data is output as a data signal. As such, when the column select signal CSL is enabled, gate transistors of a data bus that has a particular column address on the activated word line are turned on, and the primarily amplified data are transmitted to the data bus.

The primary data amplification following the row address input and before the column address input needs to be performed for a sufficient amount of time to a valid level in order to retrieve valid data. If a column address is input too early without sufficient primary data amplification, invalid data may be amplified during the secondary amplification in the column path, so that incorrect data is retrieved.

Referring to FIG. 2, when the primary data amplification in the bit lines BL and /BL ends too early, i.e., in an invalid period, the data is invalid. When the primary data amplification in the bit lines BL and /BL is done for a sufficient period of time, i.e., up to a valid period, the data is valid. In other words, only when a column address is input in the valid period, valid data can be retrieved.

However, with the recent desire for semiconductor memory devices operating at higher frequency in order to enhance system's performance, the clock cycle in synchronous semiconductor memory devices may become shorter. Accordingly, the time period allowed until a column address is input after the input of a row address may become shorter. Therefore, the column address may be input without primary data amplification for a sufficient duration so that a column select signal CSL is generated in the invalid period, as shown in FIG. 2, and thus invalid data may be retrieved.

SUMMARY OF THE INVENTION

Embodiments of the present invention provide bit line sense amplifier driving control circuits and methods for synchronous DRAMs that selectively supply and suspend supply of operating voltages for bit line sense amplifiers. More specifically, in some embodiments of the present invention, a synchronous DRAM includes a memory cell array including at least a first column block and a second column block that are divided according to column address, first bit line sense amplifiers that are configured to sense data that is output from the first column block of the memory cell array, and second bit line sense amplifiers that are configured to sense data that is output from the second column block of the memory cell array. A bit line sense amplifier driving control circuit or method is responsive to a row address select signal, to supply an operating voltage to the first and second bit line sense amplifiers, and is responsive to a column select signal that selects a column address in the first column block, to suspend supplying an operating voltage to the second bit line sense amplifiers. In other embodiments, these bit line sense amplifier driving control circuits or methods are further configured to resupply the operating voltage to the second bit line sense amplifiers a predetermined time after suspending supplying the operating voltage to the second bit line sense amplifiers.

In other embodiments, the operating voltage of the first and second bit line sense amplifiers is increased in response to the row address select signal and the operating voltage of the second bit line sense amplifiers is reduced in response to the column select signal that selects a column address in the first column block. Accordingly, some embodiments of the invention provide a bit line sense amplifier driving control circuits and methods that can enable synchronous DRAMs to operate at a higher frequency, in which the time to initially amplify a data voltage may be reduced, so that valid data can be retrieved in a shorter clock cycle.

According to some embodiments of the present invention, there is provided a bit line sense amplifier driving control circuit for a synchronous dynamic random access memory having a memory cell array including at least two column blocks divided according to column address and having a plurality of bit line sense amplifiers to sense data that is output from the memory cell array to a bit line. The bit line sense amplifier driving control circuit comprises a main control circuit, a plurality of sub control circuits, a main driving circuit, and a plurality of sub driving circuits. The main control circuit is responsive to a bit line sense amplifier sensing start signal and a predetermined row block information signal to output a main control signal that controls the sensing operation of the bit line sense amplifiers. The sub control circuits are responsive to a plurality of column block information signals and a sensing-securing delay signal to output a plurality of sub control signals. The main driving circuit drives the bit line sense amplifiers under control of the main control signal and the sub driving circuits drive the bit line sense amplifiers under control of the sub control signals.

According to other embodiments of the present invention, there is provided a bit line sense amplifier driving control method for a synchronous dynamic random access memory having a memory cell array including at least two column blocks divided according to column address and having a plurality of bit line sense amplifiers to sense data that is output from the memory cell array to a bit line. The method comprises (a) receiving a row address and enabling a sense-securing delay signal; (b) activating a word line according to the received row address and enabling a bit line sense amplifier sensing start signal; (c) turning on a main driving circuit and a plurality of sub driving circuits of all the column blocks to supply an operating voltage to the bit line sense amplifiers of all the column blocks; (d) if a column address is received, turning off a sub driving circuit of a column block which is not selected by the column address to suspend supplying the operating voltage to the bit line sense amplifiers of the not-selected column block; and (e) after a predetermined period of time, turning on the sub driving circuit of the not-selected column block which has been turned off in step (d).

Other embodiments of the invention provide a bit line sense amplifier driving control method for a synchronous DRAM having a memory cell array including at least two column blocks divided according to column address and having a plurality of bit line sense amplifiers to sense data being output from the memory cell array to a bit line. The method comprises (a) receiving a row address and enabling a sense-securing delay signal; (b) activating a word line according to the received row address and enabling a bit line sense amplifier sensing start signal; (c) turning on a main driving circuit to supply an operating voltage to the bit line sense amplifiers of all the column blocks; and (d) if a column address is received, turning on a sub driving circuit of a column block which is selected by the column address to supply the operating voltage to the bit line sense amplifiers of the selected column block while a sub driving circuit of a non-selected column block is maintained in an "off" state.

DETAILED DESCRIPTION OF PREFERRED EMBODIMENTS

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. It will be understood that when an element is referred to as being "responsive" to another element, it can be directly responsive to the other element or intervening elements may be present. In contrast, when an element is referred to as being "directly responsive" to another element, there are no intervening elements present.

Figure 1:
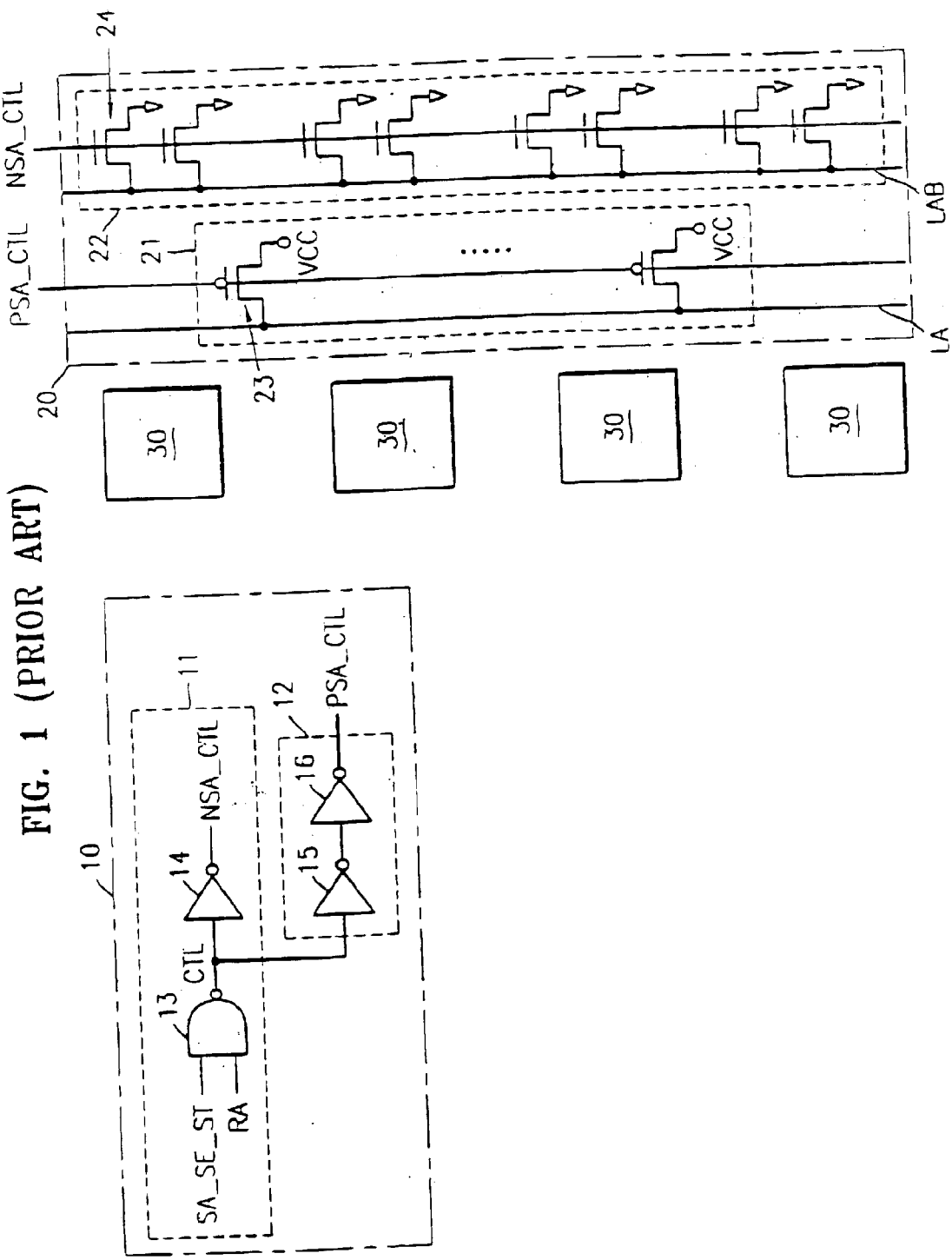
FIG. 1 is a circuit diagram showing an example of a conventional bit line sense amplifier driving control circuit.
Figure 2:
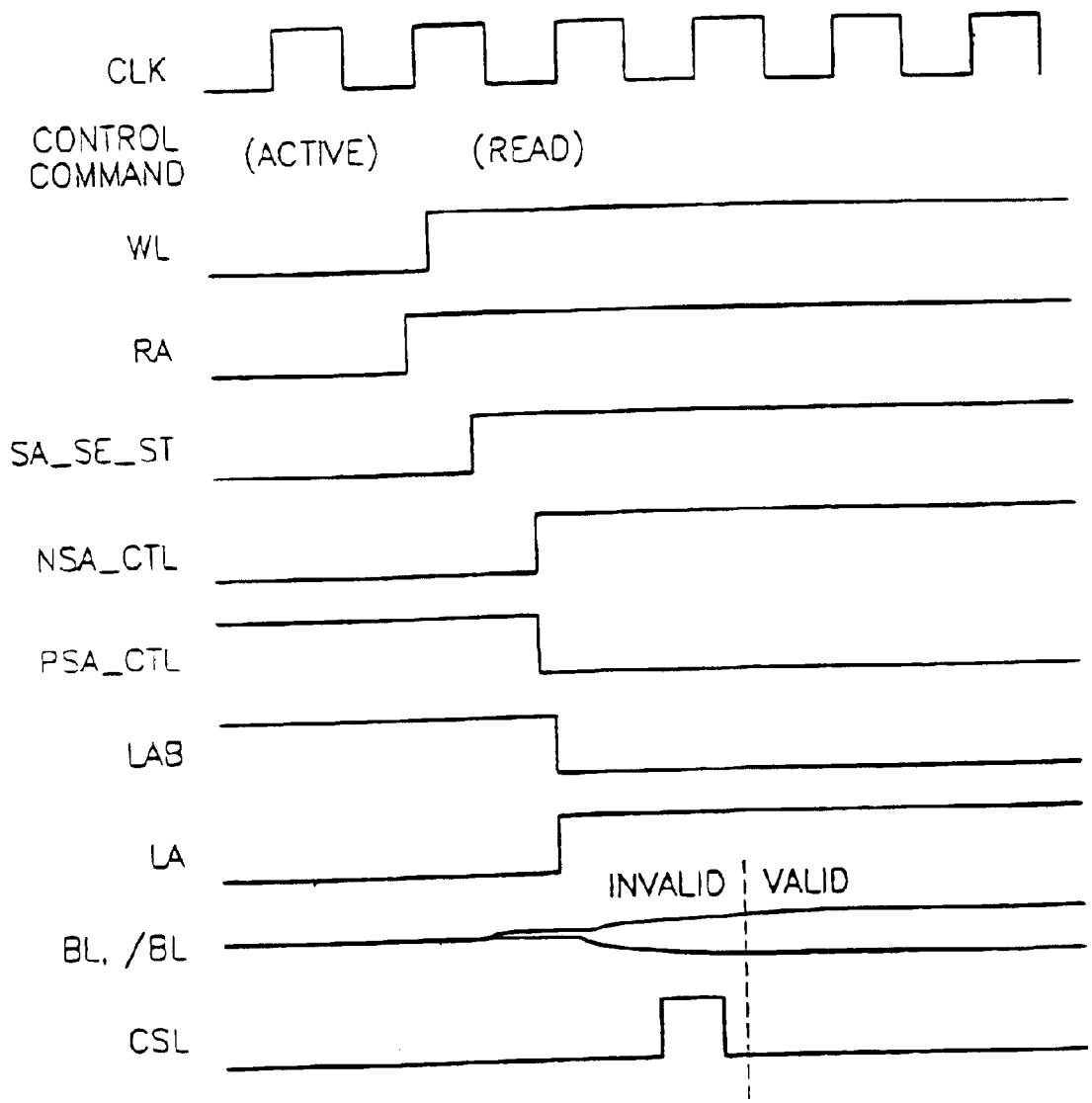
FIG. 2 is a timing diagram of input/output signals involved in the bit line sense amplifier driving control circuit shown in FIG. 1.
Figure 3:
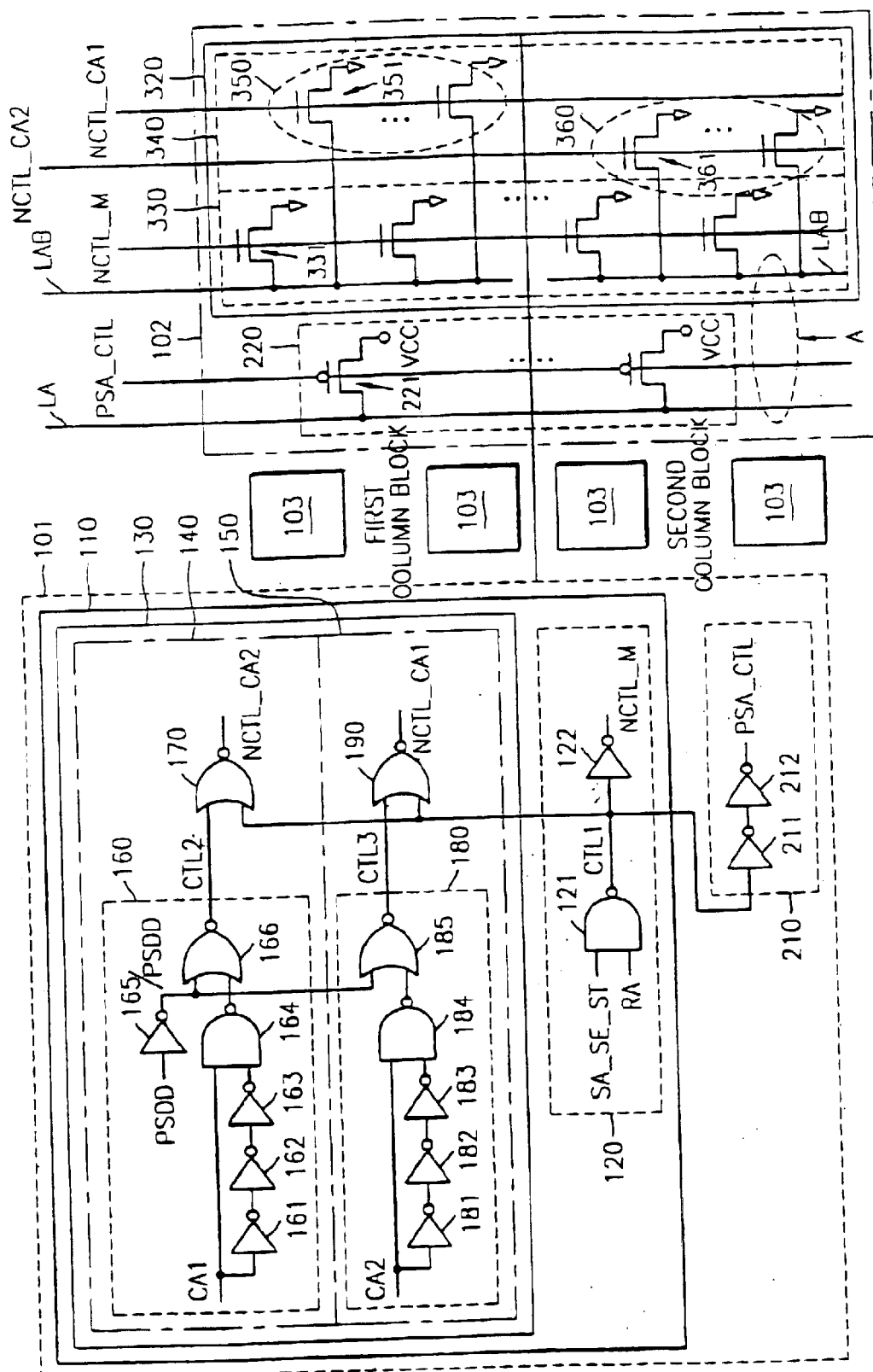
FIG. 3 is a circuit diagram of a bit line sense amplifier driving control circuit of a synchronous dynamic random access memory (DRAM) according to embodiments of the present invention.

FIG. 3 is a circuit diagram of a bit line sense amplifier driving control circuit that can enable a synchronous dynamic random access memory (DRAM) to operate at a higher frequency, according to embodiments of the present invention. Referring to FIG. 3, a bit line sense amplifier driving control circuit according to some embodiments of the present invention includes a bit line sense amplifier controller 101 and a bit line sense amplifier driver 102.

The bit line sense amplifier controller 101 includes an N sense amplifier control circuit 110 and a P sense amplifier control circuit 210. The N sense amplifier control circuit 110 outputs a plurality of control signals, and the P sense amplifier control circuit 210 outputs a P sense amplifier control signal PSA__CTL. The plurality of control signals output from the N sense amplifier control circuit 110, which are for providing an operating voltage to NMOS transistors (designated by reference numeral 42 in FIG. 4) of bit line sense amplifiers, include a main control signal NCTL__M, a first column block control signal NCTL__CA1, and a second column block control signal NCTL__CA2. The P sense amplifier control signal PSA_CTL is for providing an operating voltage to PMOS transistors (designated by reference numeral 41 in FIG. 4) of the bit line sense amplifiers.

The N sense amplifier control circuit 110 includes a main control circuit 120 and a sub control circuit 130. The main control circuit 120 is responsive to a sense amplifier sensing start signal SA__SE__ST and a row block information signal RA to output the main control signal NCTL__M. In particular, the main control circuit 120 includes a NAND gate 121 and an inverter 122. The NAND gate 121 is responsive to the sense amplifier sensing start signal SA__SE__ST and the row block information signal RA to output a first control signal CTL1. The inverter 122 inverts the first control signal CTL1 to output the main control signal NCTL__M. The sub control circuit 130 includes a first sub control circuit 140 and a second sub control circuit 150. The first sub control circuit 140 is responsive to a first column block information signal CA1, a sensing-securing delay signal PSDD, and the first control signal CTL1 to output the second column block control signal NCTL__CA2. The second sub control circuit 150 is responsive to a second column block information signal CA2, an inverted sensing-secure delay signal /PSDD, and the first control signal CTL1 to output the first column block control signal NCTL__CA1.

The first and second column block information signals CA1 and CA2 are generated by a column address input. A memory cell array includes a plurality of column blocks divided according to column address, an example of which will be described in detail with reference to Table 1.

TABLE 1

| Column block | Column address | | |
|---|---|---|---|
| | Bit 2 | Bit 1 | Bit 0 |
| First column block | 1 | 1 | 1 |
| | 1 | 1 | 0 |
| | 1 | 0 | 1 |
| | 1 | 0 | 0 |
| Second column block | 0 | 1 | 1 |
| | 0 | 1 | 0 |
| | 0 | 0 | 1 |
| | 0 | 0 | 0 |

As can be seen from Table 1, the memory cell array can be divided into the first and second column blocks according to the value of Bit 2 of column address. Bit 2 has a value of "1" for the first column block and a value of "0" for the second column block. Assuming that a column address is "100", the first column block information signal CA1 is enabled because Bit 2 of the column address is "1". Assuming that a column address is "001", the second column block information signal CA2 is enabled because Bit 2 of the column address is "0".

The sensing-securing delay signal PSDD is a signal providing a minimum amount of time delay (tRAS) to secure the sensing operation of the bit line sense amplifier. While the sensing-securing delay signal PSDD is enabled, the data voltage of the bit lines BL and /BL is amplified to a valid level. Accordingly, it is desired to increase the operating voltage of the bit line sense amplifier located in a particular column block from which data will be retrieved, during the sensing-secure delay signal enable period.

The first sub control circuit 140 includes a first logic circuit 160 and a second logic circuit 170. The first logic circuit 160 is responsive to the first column block information signal CA1 and the sensing-securing delay signal PSDD to output a second control signal CTL2. The first logic circuit 160 includes a plurality of inverters 161, 162, 163, and 165, a NAND gate 164, and a NOR gate 166. The inverters 161, 162, and 163 are sequentially connected and output an auto pulse. The inverter 161 receives the first column block information signal CA1. The NAND gate 164 is responsive to the first column block information signal CA1 and an output signal of the inverter 163. The inverter 165 inverts the sensing-securing delay signal PSDD. The NOR gate 166 is responsive to an output signal of the inverter 165 and an output signal of the NAND gate 164 to output the second control signal CTL2. The second logic circuit 170 is responsive to the second control signal CTL2 and the first control signal CTL1 to output the second column block control signal NCTL_CA2. In some embodiments, that the second logic circuit 170 is implemented with a NOR gate.

The second sub control circuit 150 includes a first logic circuit 180 and a second logic circuit 190. The first logic circuit 180 is responsive to the second column block information signal CA2 and the inverted sensing-securing delay signal /PSDD to output a third control signal CTL3. The first logic circuit 180 includes a plurality of inverters 181, 182, and 183, a NAND gate 184, and a NOR gate 185. Like the inverters 161, 162, and 163, the inverters 181, 182, and 183 are used to generate an auto pulse and are sequentially connected. The inverter 181 receives the second column block information signal CA2. The NAND gate 184 is responsive to the second column block information signal CA2 and an output signal of the inverter 183. The NOR gate 185 is responsive to the output signal of the inverter 165 and an output signal of the NAND gate 184 to output the third control signal CTL3. The second logic circuit 190 is responsive to the third control signal CTL3 and the first control signal CTL1 to output the first column block control signal NCTL_CA1. In some embodiments, the second logic circuit 190 is implemented with a NOR gate.

The P sense amplifier control circuit 210 of the bit line sense amplifier controller 101 may be implemented with inverters 211 and 212. The inverter 211 and 212 invert the first control signal CTL1 to output the P sense amplifier control signal PSA_CTL.

Next, the bit line sense amplifier driver 102 is arranged in a column direction along a plurality of memory cell arrays 103. The bit line sense amplifier driver 102 includes a P sense amplifier driving circuit 220 and an N sense amplifier driving circuit 320. The P sense amplifier driving circuit 220 is a circuit to provide an operating voltage to PMOS transistors of the bit line sense amplifiers. The N sense amplifier driving circuit 320 is a circuit to provide an operating voltage to NMOS transistors of the bit line sense amplifiers.

In particular, the P sense amplifier driving circuit 220 includes a plurality of PMOS transistors 221. Each drain of the PMOS transistors 221 is connected to a local array line LA, and each source of the PMOS transistors 221 is connected to an internal voltage VCC. Each gate of the PMOS transistors 221 receives the P sense amplifier control signal PSA_CTL. The PMOS transistors 221 are turned on or off by the P sense amplifier control signal PSA_CTL. As the PMOS transistors 221 are turned on, the local array line LA transitions to a voltage level equal to a first operating voltage VCC. In the present and following embodiments, the first operating voltage corresponds to the internal voltage VCC. The local array line LA is separated for the first and second column blocks.

The N sense amplifier driving circuit 320 includes a main driving circuit 330 and a sub driving circuit 340. The main driving circuit 330 is arranged adjacent all the column blocks of the memory cell array. The main driving circuit 330 includes a plurality of NMOS transistors 331. Each drain of the NMOS transistors 331 is connected to a local array bar line LAB, and each source of the NMOS transistors 331 is connected to a ground voltage. Each gate of the NMOS transistors 331 receives the main control signal NCTL_M. The NMOS transistors 331 are turned on or off by the main control signal NCTL_M. As the NMOS transistors 331 are turned on, the local array bar line LAB transitions to a second operating voltage. In the present and following embodiments, the second operating voltage corresponds to the ground voltage. The local array bar line LAB is separated for the first and second column blocks.

The sub driving circuit 340 includes a first sub driving circuit 350 and a second sub driving circuit 360. The first sub driving circuit 350 is arranged adjacent the first column block, and the second sub driving circuit 360 is arranged adjacent the second column block. Accordingly, an operating voltage for the bit line sense amplifiers located in the first column block is supplied by the main driving circuit 330 and the first sub driving circuit 350. An operating voltage for the bit line sense amplifiers located in the second column block is supplied by the main driving circuit 330 and the second sub driving circuit 360.

In particular, the first sub driving circuit 350 includes a plurality of NMOS transistors 351. Each drain of the NMOS transistor 351 is connected to the local array bar line LAB, and each source of the NMOS transistors 351 is connected to the ground voltage. Each gate of the NMOS transistors 351 receives the first column block control signal NCTL_CA1. The NMOS transistors 351 are turned on or off by the first column block control signal NCTL_CA1. The second sub driving circuit 360 includes a plurality of NMOS transistors 361. Each drain of the NMOS transistors 361 is connected to the local array bar line LAB, and each source of the NMOS transistors 361 is connected to the ground voltage. Each gate of the NMOS transistors 361 receives the second column block control signal NCTL_CA2. The NMOS transistors 361 are turned on or off by the second column block control signal NCTL_CA2.

Figure 4:
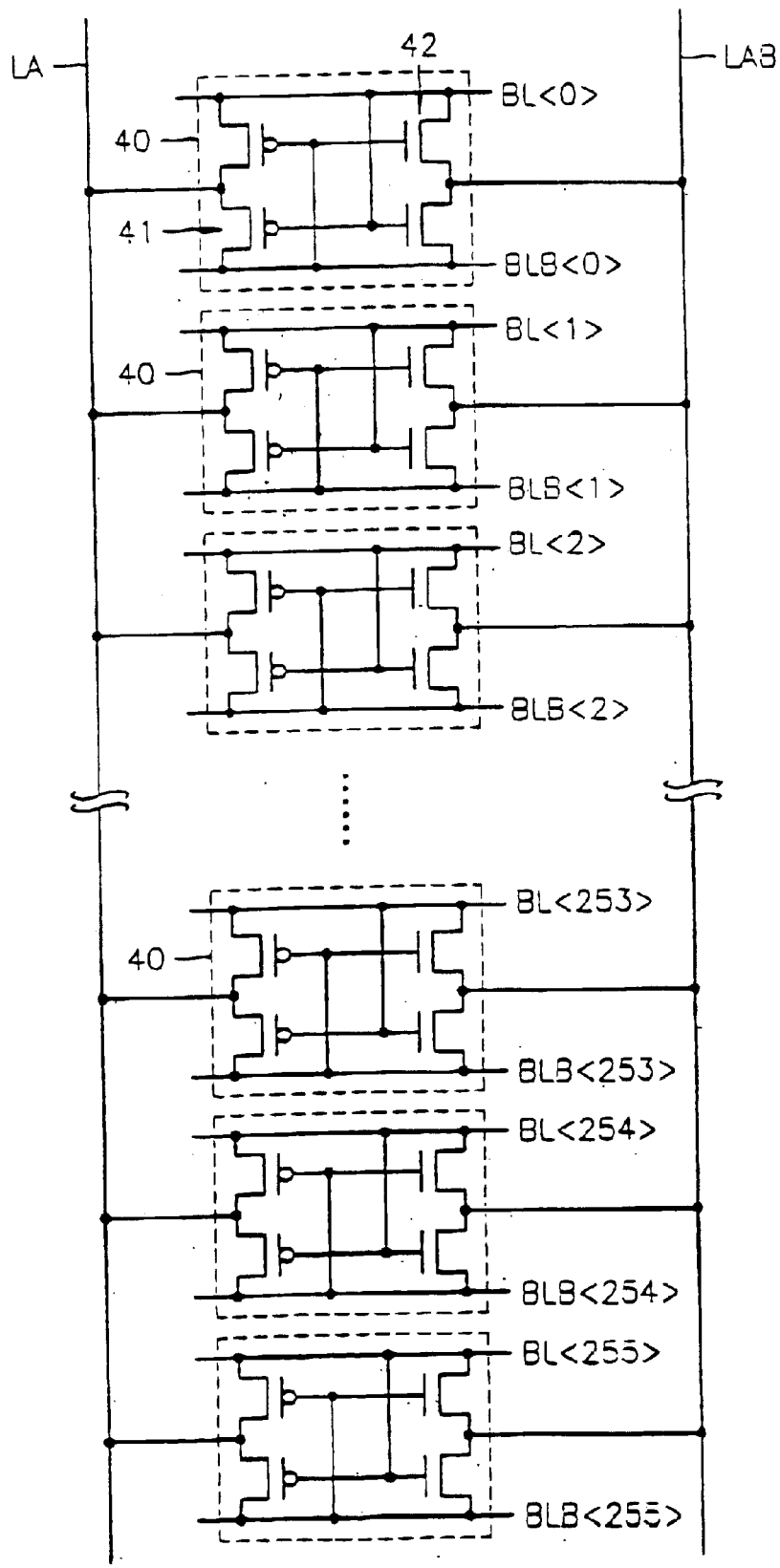
FIG. 4 is a detailed circuit diagram of portion A in the bit line sense amplifier driving control circuit shown in FIG. 3.

FIG. 4 is a detailed circuit diagram of portion A in the bit line sense amplifier driving control circuit shown in FIG. 3. Referring to FIG. 4, a plurality of bit line sense amplifiers 40 are arranged between the local array line LA and the local array bar line LAB. Each source of PMOS transistors 41 of the bit line sense amplifiers 40 is connected to the local array line LA. The PMOS transistors 41 are operated by the first operating voltage VCC of the local array line LA. Each drain of NMOS transistors 42 of the bit line sense amplifiers 40 is connected to the local array bar line LAB. The NMOS transistors 42 are operated by the second operating voltage of the local array bar line LAB. Reference to BL<x> and BLB<x> in the figures refer to the bit line and the complimentary bit line, respectively, associated with the $x^{th}$ bit line sense amplifier 40.

Figure 5:
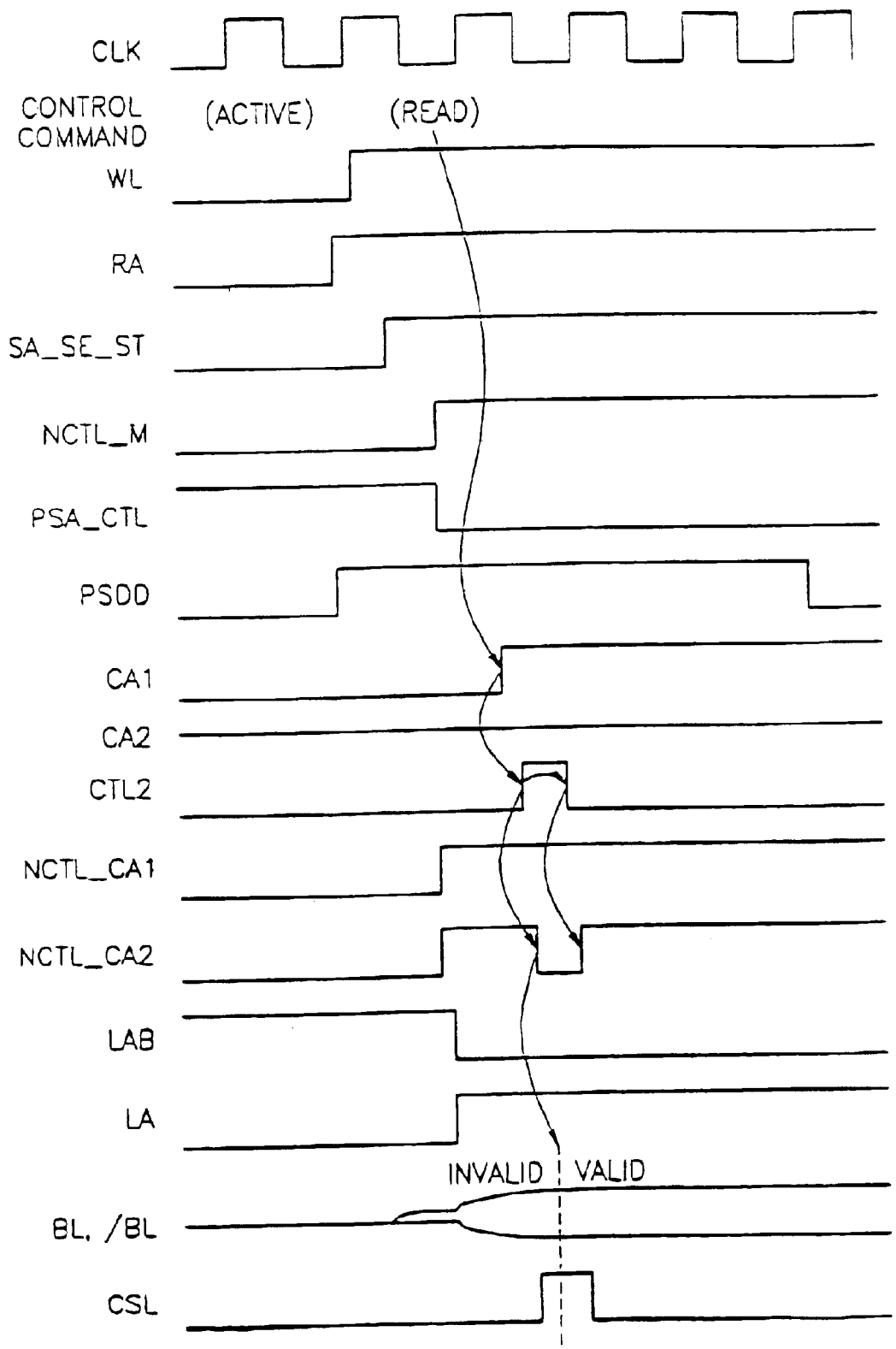
FIG. 5 is a timing diagram of input/output signals involved in the bit line sense amplifier driving control circuit shown in FIG. 3.

The operation of the bit line sense amplifier driving control circuit for a synchronous DRAM, according to the above-described embodiment of the present invention, will be described with reference to FIGS. 3 through 5. FIG. 5 is a timing diagram of input/output signals involved in the bit line sense amplifier driving control circuit shown in FIG. 3.

Referring to FIG. 5, when a control command ACTIVE is input in synchronization with a clock signal CLK and a row address is input, the sensing-securing delay signal PSDD and the row block information signal RA are enabled to activate a corresponding word line WL.

When the word line WL is activated, gates connected to the activated word line WL are turned on, and data stored in cell capacitors are transmitted to the bit line. At this time, data voltage of the bit line is slightly different from a reference voltage due to the charge sharing effect between the cell capacitors and the bit line.

When the bit line sense amplifier sensing start signal SA_SE_ST is enabled, the P sense amplifier control signal PSA_CTL, the main control signal NCTL_M, and the first and second column block control signals NCTL_CA1 and NCTL_CA2 are enabled. In particular, as the P sense amplifier control signal PSA_CTL is enabled, the PMOS transistors 221 of the P sense amplifier driving circuit 220 are turned on, and the local array line LA transitions to a voltage level of the first operating voltage VCC. The first operating voltage VCC is supplied to the PMOS transistors 41 of the bit line sense amplifiers 40. As the main control signal NCTL_M is enabled, the NMOS transistors 331 of the main driving circuit 330 are turned on. As the first and second column block control signals NCTL_CA1 and NCTL_CA2 are enabled, the NMOS transistors 351 and 361 of the first and second sub driving circuits 350 and 360 are turned on, respectively. As a result, each local array bar line LAB in the first and second column blocks transitions to a level of the second operating voltage. The second operating voltage is supplied to the NMOS transistors 42 of the bit line sense amplifiers 40. The data voltage of the bit line is primarily amplified by the bit line sense amplifiers 40.

When a read command READ is input in synchronization with the clock signal CLK, and a column address is input, the first or second column block information signal CA1 or CA2 is enabled. The case where the first column block is selected will be described with reference to FIG. 5.

When the first column block information signal CA1 is enabled, the second control signal CTL2 is enabled by the first logic circuit 160. The second control signal CTL2, an auto pulse signal, is enabled while data is output from the selected first column block.

While the second control signal CTL2 is enabled, the second column block control signal NCTL_CA2 is disabled. As the second column block control signal NCTL_CA2 is disabled, the NMOS transistors 361 are turned off, so that the supply of the second operating voltage to the local array bar line LAB of the second column block is suspended.

The second operating voltage is supplied to the local array bar line LAB of the first column block by the main driving circuit 330 and the first sub driving circuit 350. The second operating voltage is supplied to the bit line sense amplifiers 40 located in the first column block from which data will be retrieved. Meanwhile, to the bit line sense amplifiers 40 located in the second column block which will not be accessed, the second operating voltage is supplied only by the main driving circuit 330.

In other words, while data is output from the first column block, the operating voltage supplied to the bit line sense amplifiers 40 located in the first column block is increased, so that the time required to primarily amplify the data voltage of the bit line can be reduced. Since the increased operating voltage is applied to the bit line sense amplifiers 40 of the first column block, noise can also be reduced. As shown in FIG. 5, the time required to amplify the data voltage of the bit lines BL and /BL to a valid level, i.e., the invalid period, becomes short, so that valid data can be retrieved from the first column block, timely upon generation of the column select signal CSL.

Once the output of the valid data from the first column block has completed, the second column block control signal NCTL_CA2 is enabled, and the NMOS transistors 361 of the second sub driving circuit 360 are turned on to supply the second operating voltage to the bit line sense amplifiers 40 located in the second column block.

As the NMOS transistors 361 are turned on, the data stored in memory cells of the second column block are primarily amplified to a predetermined level to enable a valid data output when the second column block is selected by a next column address. This is the reason that the NMOS transistors 361 are turned on again after data has been output from the first column block.

Although in the above embodiment the case where the read command READ is input once is described with reference to FIG. 5, an additional read command READ may be input. Whenever an additional read command READ is input, the second or third control signal CTL2 or CTL3, which are auto pulse signals, is enabled. As the auto pulse signal CTL2 or CTL3 and the sensing-securing delay signal PSDD are enabled, the second or first column block control signal NCTL_CA2 or NCTL_CA1 for a non-selected column block is disabled to turn off the second or first sub driving circuit 360 or 350 in the non-selected column block.

As the sensing-securing delay signal PSDD is disabled, both the first and second column block control signals NCTL_CA1 and NCTL_CA2 are enabled to turn on the first and second sub driving circuits 350 and 360 located in all the column blocks. In this state, when an additional read command READ is input, the "on" state of the first and second sub driving circuits 350 and 360 is maintained until a data reading operation according to the additional read command READ has completed.

In other words, in a state where the sensing-securing delay signal PSDD is enabled, the sub driving circuit arranged in a non-selected column block is selectively turned off whenever the additional read command READ is input, so that the operating voltage applied to the bit line sense amplifiers in the non-selected column block is reduced in half, and the operating voltage applied to the bit line sense amplifiers in a selected column block is enhanced by that same amount. In a state where the sensing-securing delay signal PSDD is disabled and the sub driving circuits in all the column blocks are turned on, when an additional read command is input, the "on" state of the sub driving circuits in all the column blocks is maintained until the data read operation according to the additional read command READ has completed.

While the sensing-securing delay signal PSDD is enabled, the data voltage of the bit lines BL and /BL is amplified to a valid level. Once the data voltage of the bit lines BL and /BL reaches the valid level, it may be unnecessary to increase the operating voltage of bit line sense amplifiers in a column block selected by an additional read command READ, which is input after the sensing-securing delay signal PSDD has been disabled. Therefore, after the sensing-securing delay signal PSDD is disabled, the sub driving circuits of all the column blocks of the mercury array are allowed to stay in the "on" state through a data reading operation according to an additional read command input.

Figure 6:
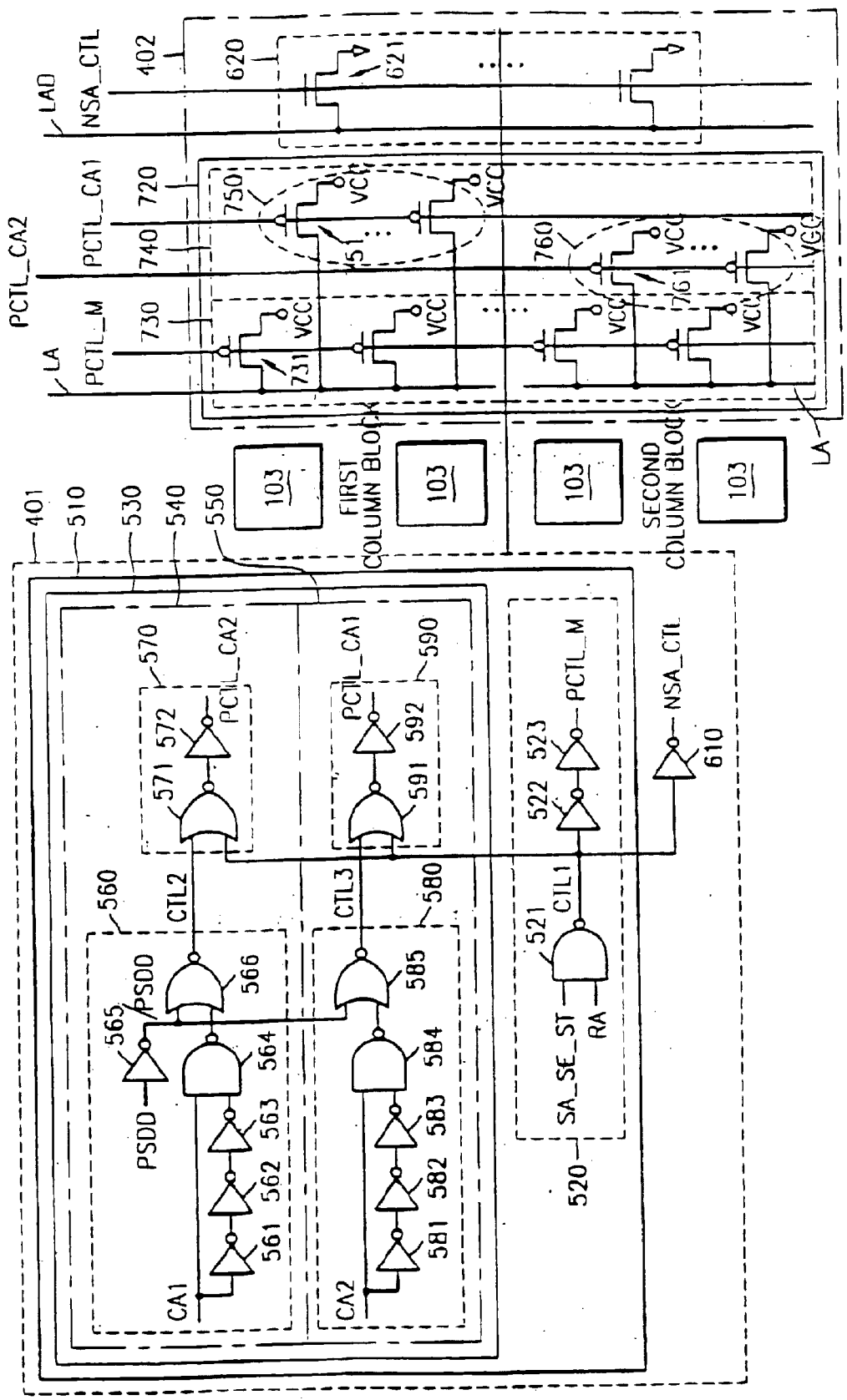
FIG. 6 is a circuit diagram of a bit line sense amplifier driving control circuit of a synchronous DRAM according to other embodiments of the present invention.

FIG. 6 is a circuit diagram of a bit line sense amplifier driving control circuit that can enable a synchronous DRAM to operate at a higher frequency, according to another embodiment of the present invention. Referring to FIG. 6, a bit line sense amplifier driving control circuit according to embodiments of the present invention includes a bit line sense amplifier controller 401 and a bit line sense amplifier driver 402.

The bit line sense amplifier controller 401 includes a P sense amplifier control circuit 510 and an N sense amplifier control circuit 610. The P sense amplifier control circuit 510 outputs a plurality of control signals for supplying an operating voltage to the PMOS transistors (designated by reference numeral 41 in FIG. 4) of the bit line sense amplifiers. The N sense amplifier control circuit 610 outputs an N sense amplifier control signal NSA_CTL for supplying an operating voltage to the NMOS transistors (designated by reference numeral 42 in FIG. 4) of the bit line sense amplifiers. The plurality of control signals output from the P sense amplifier control circuit 510 include a main control signal PCTL_M, a first column block control signal PCTL_CA1, and a second column block control signal PCTL_CA2.

The P sense amplifier control circuit 510 includes a main control circuit 520 and a sub control circuit 530. The main control circuit 520 is responsive to a sense amplifier sensing start signal SA_SE_ST and a row block information signal RA to output the main control signal PCTL_M. In particular, the main control circuit 520 includes a NAND gate 521 and inverters 522 and 523. The NAND gate 521 is responsive to the sense amplifier sensing start signal SA_SE_ST and the row block information signal RA to output a first control signal CTL1. The inverters 522 and 523 invert the first control signal CTL1 to output the main control signal PCTL_M. The sub control circuit 530 includes a first sub control circuit 540 and a second sub control circuit 550. The first sub control circuit 540 is responsive to a first column block information signal CA1, a sensing-securing delay signal PSDD, and the first control signal CTL1 to output the second column block control signal PCTL_CA2. The second sub control circuit 550 is responsive to a second column block information signal CA2, an inverted sensing-secure delay signal /PSDD, and the first control signal CTL1 to output the first column block control signal PCTL_CA1.

The first and second column block information signals CA1 and CA2 and the sensing-securing delay signal PSDD are the same as described in the above embodiment, and thus descriptions thereof will not be repeated here.

The first sub control circuit 540 includes a first logic circuit 560 and a second logic circuit 570. The first logic circuit 560 is responsive to the first column block information signal CA1 and the sensing-securing delay signal PSDD to output a second control signal CTL2. The first logic circuit 560 includes a plurality of inverters 561, 562, 563, and 565, a NAND gate 564, and a NOR gate 566. The inverters 561, 562, and 563 are sequentially connected and output an auto pulse. The inverter 561 receives the first column block information signal CA1. The NAND gate 564 is responsive to the first column block information signal CA1 and an output signal of the inverter 563. The inverter 565 inverts the sensing-securing delay signal PSDD. The NOR gate 566 is responsive to an output signal of the inverter 565 and an output signal of the NAND gate 564 to output the second control signal CTL2. The second logic circuit 570 is responsive to the second control signal CTL2 and the first control signal CTL1 to output the second column block control signal PCTL_CA2. The second logic circuit 570 may be implemented with a NOR gate 571 and an inverter 572 in some embodiments.

The second sub control circuit 550 includes a first logic circuit 580 and a second logic circuit 590. The first logic circuit 580 is responsive to the second column block information signal CA2 and the inverted sensing-securing delay signal /PSDD to output a third control signal CTL3. The first logic circuit 580 includes a plurality of inverters 581, 582, and 583, a NAND gate 584, and a NOR gate 585. Like the inverters 561, 562, and 563, the inverters 581, 582, and 583 are used to generate an auto pulse and are sequentially connected. The inverter 581 receives the second column block information signal CA2. The NAND gate 584 is responsive to the second column block information signal CA2 and an output signal of the inverter 583. The NOR gate 585 is responsive to the output signal of the inverter 565 and an output signal of the NAND gate 584 to output the third control signal CTL3. The second logic circuit 590 is responsive to the third control signal CTL3 and the first control signal CTL1 to output the first column block control signal PCTL_CA1. The second logic circuit 590 may be implemented with a NOR gate 591 and an inverter 592 in some embodiments.

The N sense amplifier control circuit 610 of the bit line sense amplifier controller 401 may be implemented with an inverter. The inverter 610 inverts the first control signal CTL1 to output the N sense amplifier control signal NSA_CTL.

Next, the bit line sense amplifier driver 402 is arranged in a column direction along a plurality of memory cell arrays 103. The bit line sense amplifier driver 402 includes an N sense amplifier driving circuit 620 and a P sense amplifier driving circuit 720. The N sense amplifier driving circuit 620 is a circuit to provide an operating voltage to the NMOS transistors (designated by reference numeral 42 in FIG. 4) of the bit line sense amplifiers. The P sense amplifier driving circuit 720 is a circuit to provide an operating voltage to the PMOS transistors (designated by reference numeral 41 in FIG. 4) of the bit line sense amplifiers.

In particular, the N sense amplifier driving circuit 620 includes a plurality of NMOS transistors 621. Each drain of the NMOS transistors 621 is connected to a local array bar line LAB, and each source of the NMOS transistors 621 is connected to a ground voltage. Each gate of the NMOS transistors 621 receives the N sense amplifier control signal NSA_CTL. The NMOS transistors 621 are turned on or off by the N sense amplifier control signal NSA_CTL. As the NMOS transistors 621 are turned on, the local array bar line LAB transitions to a level corresponding to the second operating voltage. The local array bar line LAB is separated for the first and second column blocks.

The P sense amplifier driving circuit 720 includes a main driving circuit 730 and a sub driving circuit 740. The main driving circuit 730 is arranged adjacent all the column blocks of the memory cell array. The main driving circuit 730 includes a plurality of PMOS transistors 731. Each drain of the PMOS transistors 731 is connected to a local array line LA, and each source of the PMOS transistors 731 is connected to the internal voltage VCC. Each gate of the PMOS transistors 731 receives the main control signal PCTL_M. The PMOS transistors 731 are turned on or off by the main control signal PCTL_M. As the PMOS transistors 731 are turned on, the local array line LA transitions to a level of the first operating voltage VCC. The local array line LA is separated for the first and second column blocks.

The sub driving circuit 740 includes a first sub driving circuit 750 and a second sub driving circuit 760. The first sub driving circuit 750 is arranged adjacent the first column block, and the second sub driving circuit 760 is arranged adjacent the second column block. Accordingly, an operating voltage VCC for the bit line sense amplifiers located in the first column block is supplied by the main driving circuit 730 and the first sub driving circuit 750. An operating voltage VCC for the bit line sense amplifiers located in the second column block is supplied by the main driving circuit 730 and the second sub driving circuit 760.

In particular, the first sub driving circuit 750 includes a plurality of PMOS transistors 751. Each drain of the PMOS transistor 751 is connected to the local array line LA, and each source of the PMOS transistors 751 is connected to the internal voltage VCC. Each gate of the PMOS transistors 751 receives the first column block control signal PCTL__CA1. The PMOS transistors 751 are turned on or off by the first column block control signal PCTL__CA1. The second sub driving circuit 760 includes a plurality of PMOS transistors 761. Each drain of the PMOS transistors 761 is connected to the local array line LA, and each source of the PMOS transistors 761 is connected to the internal voltage VCC. Each gate of the PMOS transistors 761 receives the second column block control signal PCTL__CA2. The PMOS transistors 761 are turned on or off by the second column block control signal PCTL__CA2.

The operation of the bit line sense amplifier driving control circuit for a synchronous DRAM, having the configuration as described with reference to FIG. 6, according to the present invention will be described with reference to FIG. 6.

When a control command ACTIVE is input in synchronization with a clock signal CLK and a row address is input, the sensing-securing delay signal PSDD and the row block information signal RA are enabled to activate a corresponding word line WL.

When the word line WL is activated, gates connected to the activated word line WL are turned on, and data stored in cell capacitors are transmitted to the bit line. At this time, data voltage of the bit line is slightly different from a reference voltage due to the charge sharing effect between the cell capacitors and the bit line.

When the bit line sense amplifier sensing start signal SA__SE__ST is enabled, the N sense amplifier control signal NSA__CTL, the main control signal PCTL__M, and the first and second column block control signals PCTL__CA1 and PCTL__CA2 are enabled. In particular, as the N sense amplifier control signal NSA__CTL is enabled, the NMOS transistors 621 of the N sense amplifier driving circuit 620 are turned on. As the main control signal PCTL__M is enabled, the PMOS transistors 731 of the main driving circuit 730 are turned on. As the first and second column block control signals PCTL__CA1 and PCTL__CA2 are enabled, the PMOS transistors 751 and 761 of the first and second sub driving circuits 750 and 760 are turned on, respectively. When the PMOS transistors 621 of the N sense amplifier driving circuit 620 are turned on, the local array bar line LAB transitions to a voltage level of the second operating voltage, and the second operating voltage is supplied to the NMOS transistors 42 shown in FIG. 4 of the bit line sense amplifiers 40. When the PMOS transistors 731, 751, and 761 are turned on, each local array line LA in the first and second column blocks transitions to a level of the first operating voltage VCC, and the first operating voltage VCC is supplied to the PMOS transistors 41 of the bit line sense amplifiers 40. The data voltage of the bit line is primarily amplified by the bit line sense amplifiers 40.

When a read command READ is input in synchronization with the clock signal CLK, and a column address is input, the first or second column block information signal CA1 or CA2 is enabled. The case where the first column block is selected will be described in this embodiment.

When the first column block information signal CA1 is enabled, the second control signal CTL2 is enabled by the first logic circuit 560. The second control signal CTL2, an auto pulse signal, is enabled while data is output from the selected first column block.

While the second control signal CTL2 is enabled, the second column block control signal PCTL__CA2 is disabled. As the second column block control signal PCTL__CA2 is disabled, the PMOS transistors 761 are turned off, so that the supply of the first operating voltage VCC to the local array line LA of the second column block is suspended. As a result, the supply of the first operating voltage VCC to the bit line sense amplifiers located in the second column block is suspended.

The second operating voltage is supplied to the bit line sense amplifiers 40 located in the first column block from which data will be retrieved by the main driving circuit 730 and the first sub driving circuit 750. Meanwhile, to the bit line sense amplifiers 40 located in the second column block which will not be accessed, the second operating voltage is supplied only by the main driving circuit 730.

In other words, while data is output from the first column block, the operating voltage supplied to the bit line sense amplifiers 40 located in the first column block is increased, so that the time required to primarily amplify the data voltage of the bit line can be reduced. Since the increased operating voltage is applied to the bit line sense amplifiers 40 of the first column block, noise can also be reduced. As shown in FIG. 5, the time required to amplify the data voltage of the bit lines BL and /BL to a valid level, i.e., the invalid period, becomes short, so that valid data can be retrieved from the first column block, timely upon generation of the column select signal CSL.

Once the output of the valid data from the first column block has completed, the second column block control signal NCTL__CA2 is enabled, and the PMOS transistors 761 of the second sub driving circuit 760 are turned on to supply the operating voltage to the bit line sense amplifiers 40 located in the second column block.

As the PMOS transistors 761 are turned on, the data stored in memory cells of the second column block are primarily amplified to a predetermined level to enable a valid data output when the second column block is selected by a next column address. This is the reason that the PMOS transistors 761 are turned on again after data has been output from the first column block.

Although in the above embodiment the case where the read command READ is input once is described with reference to FIG. 6, an additional read command READ may be input. Whenever an additional read command READ is input, the second or third control signal CTL2 or CTL3, which are auto pulse signals, is enabled. As the auto pulse signal CTL2 or CTL3 and the sensing-securing delay signal PSDD are enabled, the second or first column block control signal PCTL__CA2 or PCTL__CA1 for a non-selected column block is disabled to turn off the first or second sub driving circuit 750 or 760 in the non-selected column block.

As the sensing-securing delay signal PSDD is disabled, both the first and second column block control signals PCTL__CA1 and PCTL__CA2 are enabled to turn on the first and second sub driving circuits 750 and 760 located in all the column blocks. In this state, when an additional read command READ is input, the "on" state of the first and second sub driving circuits 750 and 760 is maintained until a data reading operation according to the additional read command READ has completed.

In other words, in a state where the sensing-securing delay signal PSDD is enabled, the sub driving circuit arranged in a non-selected column block is selectively turned off whenever the additional read command READ is input, so that the operating voltage applied to the bit line sense amplifiers in the non-selected column block is reduced in half, and the operating voltage applied to the bit line sense amplifiers in a selected column block is enhanced by that same amount. In a state where the sensing-securing delay signal PSDD is disabled and the sub driving circuits in all the column blocks are turned on, when an additional read command is input, the "on" state of the sub driving circuits in all the column blocks is maintained until the data read operation according to the additional read command READ has completed.

While the sensing-securing delay signal PSDD is enabled, the data voltage of the bit lines BL and /BL is amplified to a valid level. Once the data voltage of the bit lines BL and /BL reaches the valid level, it is unnecessary to increase the operating voltage of bit line sense amplifiers in a column block selected by an additional read command READ, which is input after the sensing-securing delay signal PSDD has been disabled. Therefore, after the sensing-securing delay signal PSDD is disabled, the sub driving circuits of all the column blocks of the memory array are allowed to stay in the "on" state through a data reading operation according to an additional read command input.

The structure of the bit line sense amplifier driving control circuit for a synchronous DRAM according to the present invention illustrated in FIG. 6 may be varied in combination with the structure of the bit line sense amplifier driving control circuit illustrated in FIG. 3.

Figure 7:
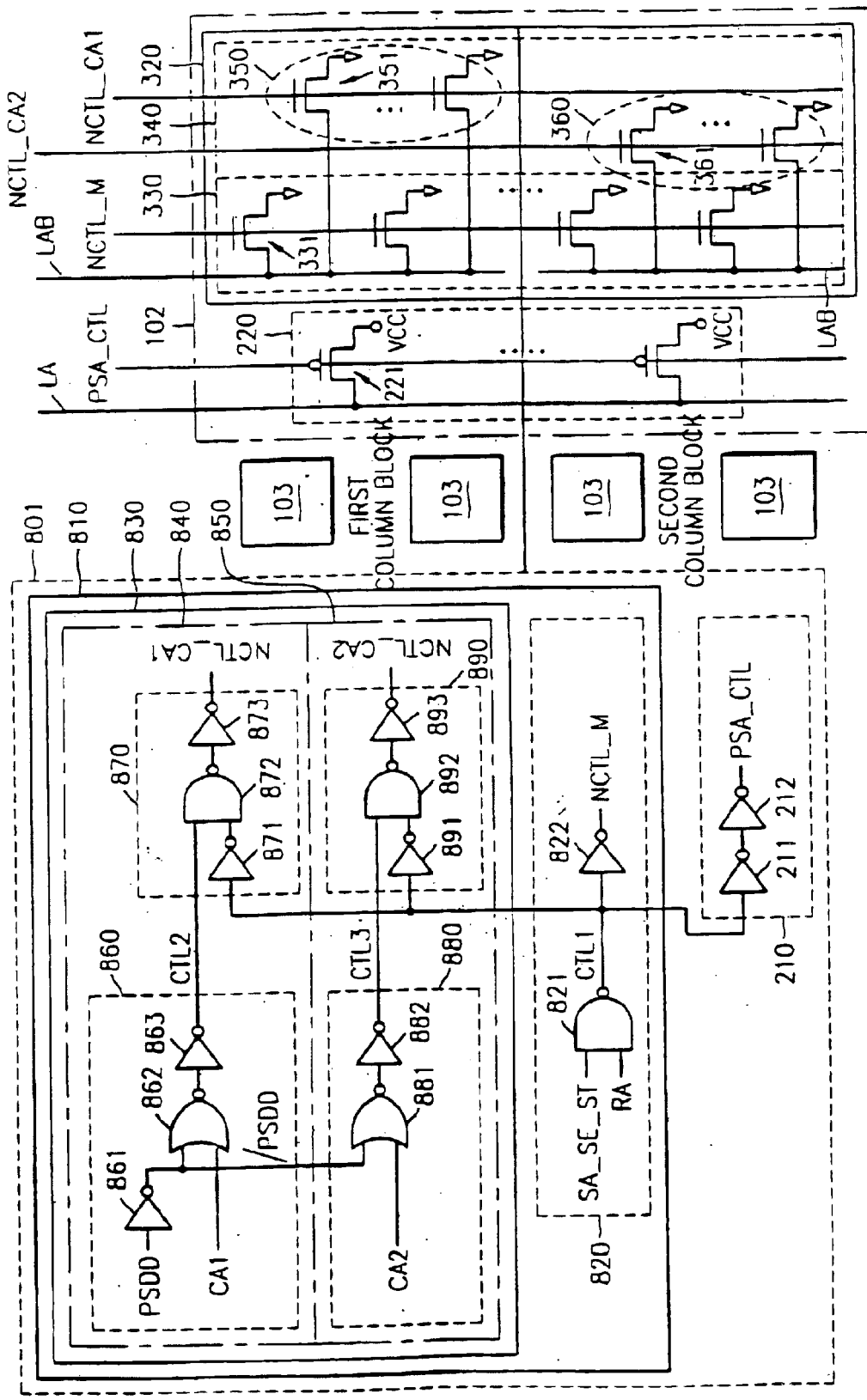
FIG. 7 is a circuit diagram of a bit line sense amplifier driving control circuit of a synchronous DRAM according to still other embodiments of the present invention.

FIG. 7 is a circuit diagram of a bit line sense amplifier driving control circuit that can enable a synchronous DRAM to operate at a higher frequency, according to still other embodiments of the present invention. Referring to FIG. 7, a bit line sense amplifier driving control circuit according to the present invention includes a bit line sense amplifier controller 801 and a bit line sense amplifier driver 102.

The bit line sense amplifier controller 801 includes an N sense amplifier control circuit 810 and a P sense amplifier control circuit 210. The N sense amplifier control circuit 810 outputs a plurality of control signals for supplying an operating voltage to the NMOS transistors 42 of the bit line sense amplifiers 40 shown in FIG. 4. The P sense amplifier control circuit 210 outputs a P sense amplifier control signal PSA_CTL for supplying an operating voltage to the PMOS transistors 41 of the bit line sense amplifiers 40 shown in FIG. 4. The plurality of control signals output from the N sense amplifier control circuit 810 include a main control signal NCTL_M, a first column block control signal NCTL_CA1, and a second column block control signal NCTL_CA2.

The N sense amplifier control circuit 810 includes a main control circuit 820 and a sub control circuit 830. The main control circuit 820 is responsive to a sense amplifier sensing start signal SA_SE_ST and a row block information signal RA to output the main control signal NCTL_M. In particular, the main control circuit 820 includes a NAND gate 821 and an inverter 822. The NAND gate 821 is responsive to the sense amplifier sensing start signal SA_SE_ST and the row block information signal RA to output a first control signal CTL1. The inverter 822 inverts the first control signal CTL1 to output the main control signal NCTL_M. The sub control circuit 830 includes a first sub control circuit 840 and a second sub control circuit 850. The first sub control circuit 840 is responsive to a first column block information signal CA1, a sensing-securing delay signal PSDD, and the first control signal CTL1 to output the first column block control signal NCTL_CA1. The second sub control circuit 850 is responsive to a second column block information signal CA2, an inverted sensing-secure delay signal /PSDD, and the first control signal CTL1 to output the second column block control signal NCTL_CA2.

The first and second column block information signals CA1 and CA2 and the sensing-securing delay signal PSDD are the same as in the embodiment described with reference to FIG. 3 above, and thus descriptions thereof will be omitted.

The first sub control circuit 840 includes a first logic circuit 860 and a second logic circuit 870. The first logic circuit 860 is responsive to the first column block information signal CA1 and the sensing-securing delay signal PSDD to output a second control signal CTL2. The first logic circuit 860 includes inverters 861 and 863 and a NOR gate 862. The inverter 861 inverts the sensing-securing delay signal PSDD. The NAND gate 862 is responsive to an output signal of the inverter 861 and the first column block information signal CA1. The inverter 863 inverts an output signal of the NOR gate 862 to output the second control signal CTL2. The second logic circuit 870 includes inverters 871 and 893 and a NAND gate 872. The inverter 871 inverts the first control signal CTL1. The NAND gate 872 is responsive to an output signal of the inverter 871 and the second control signal CTL2. The inverter 873 inverts an output signal of the NAND gate 872 to output the first column block control signal NCTL_CA1.

The second sub control circuit 850 includes a first logic circuit 880 and a second logic circuit 890. The first logic circuit 880 is responsive to the second column block information signal CA2 and the inverted sensing-securing delay signal /PSDD to output a third control signal CTL3. The first logic circuit 880 includes a NOR gate 881 and an inverter 882. The NOR gate 881 is responsive to the second column block information signal CA2 and an output signal of the inverter 861. The inverter 882 inverts an output signal of the NOR gate 881 to output the third control signal CTL3. The second logic circuit 890 includes inverters 891 and 893 and a NAND gate 892. The inverter 891 inverts the first control signal CTL1. The NAND gate 892 is responsive to the third control signal CTL3 and an output signal of the inverter 891. The inverter 893 inverts an output signal of the NAND gate 892 to output the second column block control signal NCTL_CA2.

The P sense amplifier control circuit 210 of the bit line sense amplifier controller 801 may be implemented with inverters 211 and 212. The inverter 211 and 212 invert the first control signal CTL1 to output the P sense amplifier control signal PSA_CTL.

The structure and operation of the bit line sense amplifier driver 102 are the same as in the embodiment described above with reference to FIG. 3, and thus descriptions thereof will be omitted.

Figure 8:
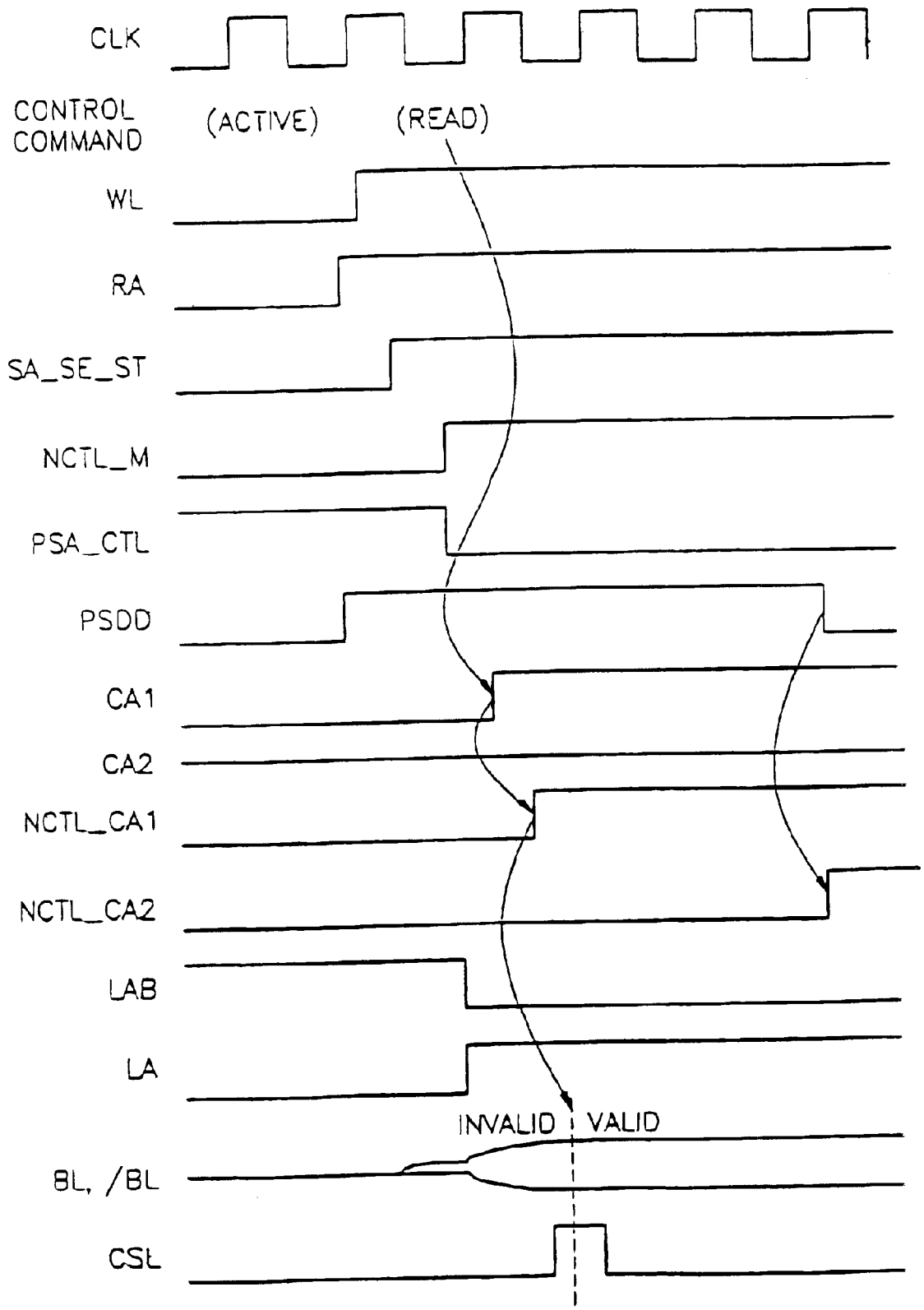
FIG. 8 is a timing diagram of input/output signals involved in the bit line sense amplifier driving control circuit shown in FIG. 7.

The operation of the bit line sense amplifier driving control circuit for a synchronous DRAM according to the present invention, described with reference to FIG. 7, will be described with reference to FIG. 8. FIG. 8 is a timing diagram of input/output signals involved in the bit line sense amplifier driving control circuit shown in FIG. 7.

Referring to FIG. 8, when a control command ACTIVE is input in synchronization with a clock signal CLK and a row address signal is input, the row block information signal RA and the sensing-securing delay signal PSDD are enabled to activate a corresponding word line WL.

Next, as the bit line sense amplifier sensing start signal SA_SE_ST is enabled, the P sense amplifier control signal PSA_CTL and the main control signal NCTL_M. In particular, as the P sense amplifier control signal PSA_CTL is enabled, the PMOS transistors 221 of the P sense amplifier driving circuit 220 are turned on, and the local array line LA becomes to have a voltage level of the first operating voltage VCC. The first operating voltage VCC is supplied to the PMOS transistors 41 of the bit line sense amplifiers 40. As the main control signal NCTL_M is enabled, the NMOS transistors 331 of the main driving circuit 330 are turned on. As a result, each local array bar line LAB in the first and second column blocks transitions to a level of the second operating voltage. The second operating voltage is supplied to the NMOS transistors 42 of the bit line sense amplifiers 40. At this time, the NMOS transistors 351 and 361 of the sub driving circuit 340 are in the "off" state.

Next when a read command READ is input in synchronization with the clock signal CLK, and a column address is input, the first or second column block information signal CA1 or CA2 is enabled. The case where the first column block is selected will be described with reference to FIG. 8.

When the first column block information signal CA1 is enabled, the first column block control signal NCTL_CA1 is enabled to turn on the NMOS transistors 351 of the first sub driving circuit 350. As a result, the second operating voltage is supplied to the bit line sense amplifiers in the first column block by both the NMOS transistors 331 and 351. To the bit line sense amplifiers in the non-selected second column block, the second operating voltage is supplied only by the NMOS transistors 331 of the main driving circuit 330.

In other words, while data is output from the first column block, the operating voltage supplied to the bit line sense amplifiers 40 located in the first column block is increased, so that the time required to primarily amplify the data voltage of the bit lines BL and /BL can be reduced. Accordingly, valid data can be retrieved from the first column block, timely upon generation of the column select signal CSL, which enables the bit lines BL and /BL line to retrieve the primarily amplified data.

Although in the above embodiment the case where the read command READ is input once is described with reference to FIG. 8, an additional read command READ may be input. For example, when an additional read command READ is input while the sensing-securing delay signal PSDD is enabled, the first or second column block control signal NCTL_CA1 or NCTL_CA2 for a non-selected column block is disabled whenever the additional read command READ is input, to selectively turn off the first or second sub driving circuit 350 or 360 arranged in the non-selected column block.

As the sensing-securing delay signal PSDD is disabled, both the first and second sub driving circuits 350 and 360 in all the column blocks are turned on. In this state, when an additional read command READ is input, the "on" state of the first and second sub driving circuits 350 and 360 is maintained until a data reading operation according to the additional read command READ has completed.

In other words, in a state where the sensing-securing delay signal PSDD is enabled, the sub driving circuit arranged in a non-selected column block is selectively turned off whenever the additional read command READ is input, so that the operating voltage applied to the bit line sense amplifiers in the non-selected column block is reduced in half, and the operating voltage applied to the bit line sense amplifiers in a selected column block is enhanced by that same amount. In a state where the sensing-securing delay signal PSDD is disabled and the sub driving circuits in all the column blocks are turned on, when an additional read command READ is input, the "on" state of the sub driving circuits is maintained until the data read operation according to the additional read command READ has completed.

While the sensing-securing delay signal PSDD is enabled, the data voltage of the bit lines BL and /BL is amplified to a valid level. Once the data voltage of the bit lines BL and /BL reaches the valid level, it is unnecessary to increase the operating voltage of bit line sense amplifiers in a column block selected by an additional read command READ, which is input after the sensing-securing delay signal PSDD has been disabled. Therefore, after the sensing-securing delay signal PSDD is disabled, the sub driving circuits of all the column blocks of the memory array are allowed to stay in the "on" state through a data reading operation according to an additional read command input.

Figure 9:
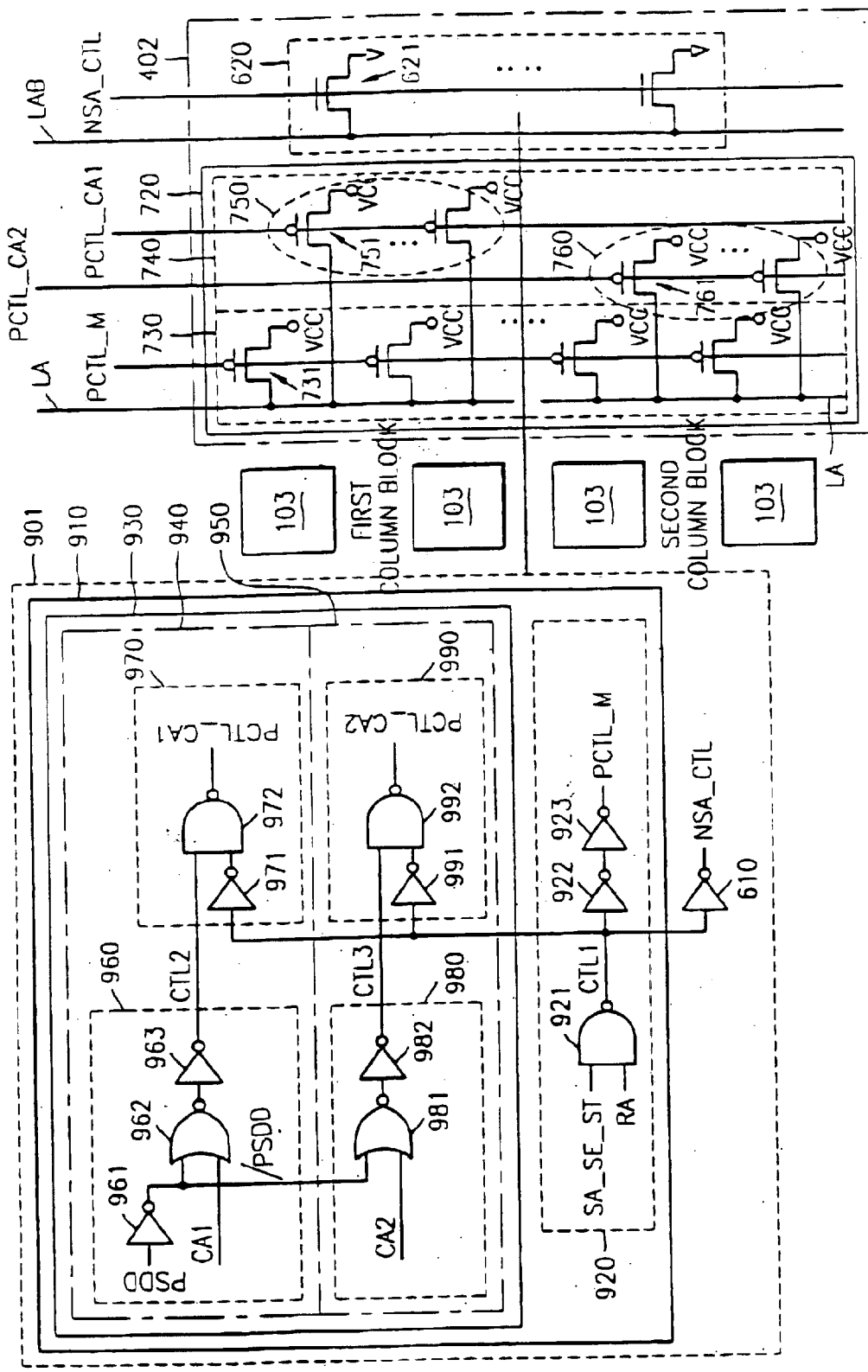
FIG. 9 is a circuit diagram of a bit line sense amplifier driving control circuit of a synchronous DRAM according to other embodiments of the present invention.

FIG. 9 is a circuit diagram of a bit line sense amplifier driving control circuit that can enable a synchronous DRAM to operate at a higher frequency, according to other embodiments of the present invention. Referring to FIG. 9, a bit line sense amplifier driving control circuit according to the present invention includes a bit line sense amplifier controller 901 and a bit line sense amplifier driver 402.

The bit line sense amplifier controller 901 includes a P sense amplifier control circuit 910 and an N sense amplifier control circuit 610. The P sense amplifier control circuit 910 outputs a plurality of control signals for supplying an operating voltage to the PMOS transistors 41 of the bit line sense amplifiers 40 shown in FIG. 4. The N sense amplifier control circuit 610 outputs an N sense amplifier control signal NSA_CTL for supplying an operating voltage to the NMOS transistors 42 of the bit line sense amplifiers 40. The plurality of control signals output from the P sense amplifier control circuit 910 include a main control signal PCTL_M, a first column block control signal PCTL_CA1, and a second column block control signal PCTL_CA2.

The P sense amplifier control circuit 910 includes a main control circuit 920 and a sub control circuit 930. The main control circuit 920 is responsive to a sense amplifier sensing start signal SA_SE_ST and a row block information signal RA to output the main control signal PCTL_M. In particular, the main control circuit 920 includes a NAND gate 921 and inverters 922 and 923. The NAND gate 921 is responsive to the sense amplifier sensing start signal SA_SE_ST and the row block information signal RA to output a first control signal CTL1. The inverters 922 and 923 invert the first control signal CTL1 to output the main control signal PCTL_M. The sub control circuit 930 includes a first sub control circuit 940 and a second sub control circuit 950. The first sub control circuit 940 is responsive to a first column block information signal CA1, a sensing-securing delay signal PSDD, and the first control signal CTL1 to output the first column block control signal PCTL_CA1. The second sub control circuit 950 is responsive to a second column block information signal CA2, an inverted sensing-secure delay signal /PSDD, and the first control signal CTL1 to output the second column block control signal PCTL_CA2.

The first and second column block information signals CA1 and CA2 and the sensing-securing delay signal PSDD are the same as in the embodiment above described with reference to FIG. 3, and thus descriptions thereof will not be repeated here.

The first sub control circuit 940 includes a first logic circuit 960 and a second logic circuit 970. The first logic circuit 960 is responsive to the first column block information signal CA1 and the sensing-securing delay signal PSDD to output a second control signal CTL2. The first logic circuit 960 includes inverters 961 and 963, and a NOR gate 962. The inverter 961 inverts the sensing-securing delay signal PSDD. The NAND gate 962 is responsive to an output signal of the inverter 961 and the first column block information signal CA1. The inverter 963 inverts an output signal of the NOR gate 962 to output the second control signal CTL2. The second logic circuit 970 includes an inverter 971 and a NAND gate 972. The inverter 971 inverts the first control signal CTL1. The NAND gate 972 is responsive to an output signal of the inverter 971 and the second control signal CTL2 to output the first column block control signal PCTL__CA1.

The second sub control circuit 950 includes a first logic circuit 980 and a second logic circuit 990. The first logic circuit 980 is responsive to the second column block information signal CA2 and the inverted sensing-securing delay signal /PSDD to output a third control signal CTL3. The first logic circuit 980 includes a NOR gate 981 and an inverter 982. The NOR gate 981 is responsive to the second column block information signal CA2 and an output signal of the inverter 961. The inverter 982 inverts an output signal of the NOR gate 981 to output the third control signal CTL3. The second logic circuit 990 includes an inverter 991 and a NAND gate 992. The inverter 991 inverts the first control signal CTL1. The NAND gate 992 is responsive to the third control signal CTL3 and an output of the inverter 991 to output the second column block control signal PCTL__CA2.

The N sense amplifier control circuit 610 of the bit line sense amplifier controller 901 may be implemented with an inverter. The inverter 610 inverts the first control signal CTL1 to output the N sense amplifier control signal NSA__CTL.

The structure and operation of the bit line sense amplifier driver 402 are the same as in the embodiment described above with reference to FIG. 6, and thus descriptions thereof will be omitted.

The operation of the bit line sense amplifier driving control circuit for a synchronous DRAM, having the configuration as described with reference to FIG. 9, according to embodiments of the present invention will be described with reference to FIG. 9.

When a control command ACTIVE is input in synchronization with a clock signal CLK and a row address is input, the sensing-securing delay signal PSDD and the row block information signal RA are enabled to activate a corresponding word line WL.

As the bit line sense amplifier sensing start signal SA__SE__ST is enabled, the N sense amplifier control signal NSA__CTL and the main control signal PCTL__M are enabled. In particular, as the N sense amplifier control signal NSA__CTL is enabled, the NMOS transistors 621 of the N sense amplifier driving circuit 620 are turned on. The second operating voltage is supplied to the local array bar line LAB by the NMOS transistors 621 and to the NMOS transistors 42 of the bit line sense amplifiers 40 shown in FIG. 4. As the main control signal PCTL__M is enabled, the PMOS transistors 731 of the main driving circuit 730 are turned on. The first operating voltage VCC is supplied to the local array line LA by the PMOS transistors 731 and to the PMOS transistors 41 of the bit line sense amplifiers 40 shown in FIG. 4. At this time, the PMOS transistors 751 and 761 of the sub driving circuit 740 are in the "off" state.

When a read command READ is input in synchronization with the clock signal CLK, and a column address is input, the first or second column block information signal CA1 or CA2 is enabled. The case where the first column block is selected will be described in this embodiment.

When the first column block information signal CA1 is enabled, the first column block control signal PCTL__CA1 is enabled to turn on the PMOS transistors 751 of the first sub driving circuit 750. As a result, the first operating voltage VCC is supplied to the bit line sense amplifiers in the first column block by both the PMOS transistors 731 and 751. To the bit line sense amplifiers in the non-selected second column block, the first operating voltage VCC is supplied only by the PMOS transistors 731.

In other words, while data is output from the first column block, the operating voltage supplied to the bit line sense amplifiers 40 located in the first column block is increased, so that the time required to primarily amplify the data voltage of the bit lines BL and /BL can be reduced. Accordingly, valid data can be retrieved from the first column block, timely upon generation of the column select signal CSL, which enables the bit lines BL and /BL line to retrieve the primarily amplified data.

Although in the above embodiment the case where the read command READ is input once is described with reference to FIG. 9, an additional read command READ may be input. For example, when an additional read command READ is input while the sensing-securing delay signal PSDD is enabled, the first or second column block control signal PCTL__CA1 or PCTL__CA2 for a non-selected column block is disabled whenever the additional read command READ is input, to selectively turn off the first or second sub driving circuit 750 or 760 arranged in the non-selected column block.

As the sensing-securing delay signal PSDD is disabled, both the first and second column block control signals PCTL__CA1 and PCTL__CA2 for all the column blocks of the memory array are enabled to turn on the first and second sub driving circuits 750 and 760 in all the column blocks. In this state, when an additional read command READ is input, the "on" state of the first and second sub driving circuits 750 and 760 is maintained until a data reading operation according to the additional read command READ has completed.

In other words, in a state where the sensing-securing delay signal PSDD is enabled, the sub driving circuit arranged in a non-selected column block is selectively turned off whenever the additional read command READ is input, so that the operating voltage applied to the bit line sense amplifiers in the non-selected column block is reduced in half, and the operating voltage applied to the bit line sense amplifiers in a selected column block is enhanced by that same amount. In a state where the sensing-securing delay signal PSDD is disabled and the sub driving circuits in all the column blocks are turned on, when an additional read command READ is input, the "on" state of the sub driving circuits is maintained until the data read operation according to the additional read command READ has completed.

While the sensing-securing delay signal PSDD is enabled, the data voltage of the bit lines BL and /BL is amplified to a valid level. Once the data voltage of the bit lines BL and /BL reaches the valid level, it is unnecessary to increase the operating voltage of bit line sense amplifiers in a column block selected by an additional read command READ, which is input after the sensing-securing delay signal PSDD has been disabled. Therefore, after the sensing-securing delay signal PSDD is disabled, the sub driving circuits of all the column blocks of the memory array are allowed to stay in the "on" state through a data reading operation according to an additional read command input.

The structure of the bit line sense amplifier driving control circuit for a high frequency synchronous DRAM according to embodiments of the present invention illustrated in FIG. 9 may be varied in combination with the structure of the bit line sense amplifier driving control circuit illustrated in FIG. 7.

Figure 10:
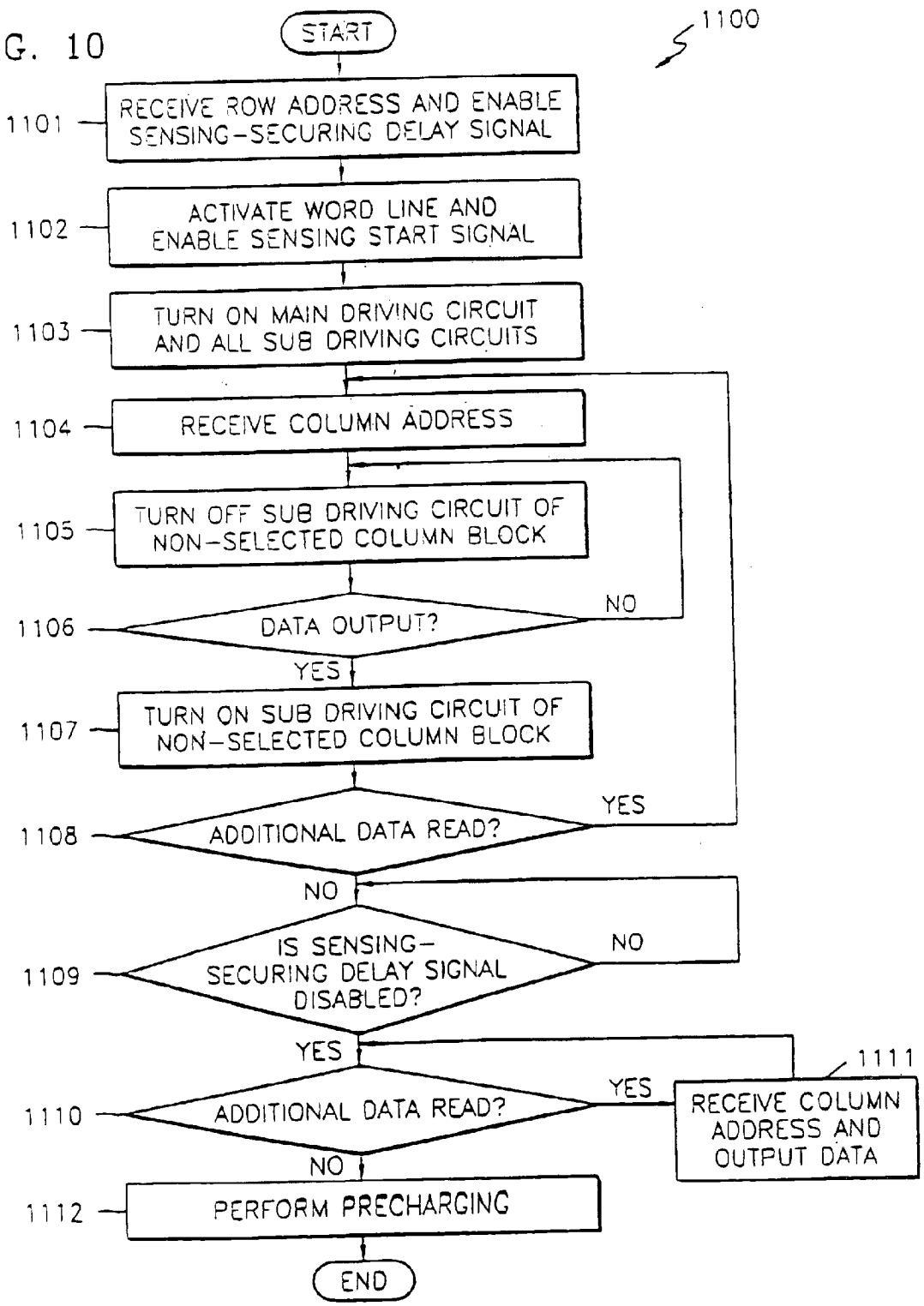
FIG. 10 is a flowchart illustrating operation of a bit line sense amplifier driving control circuits of a synchronous DRAM according to embodiments of the present invention, which are described above with reference to FIGS. 3 and 6.

FIG. 10 is a flowchart 1100 illustrating operations of bit line sense amplifier driving control circuits that can enable a synchronous DRAM to operate at a higher frequency according to embodiments of the present invention, which are described above with reference to FIGS. 3 and 6.

Referring to FIG. 10, when a control command ACTIVE and a row address are received, the sensing-securing delay signal PSDD is enabled in Block 1101. Then, a corresponding word line is activated, and the bit line sensing start signal SA_SE_ST is enabled in Block 1102. The main driving circuit 330 (730) and the first and second sub driving circuits 350 (750) and 360 (760) in all the column blocks of the memory array are turned on in Block 1103. The operations of the main driving circuit 330 (730) and the first and second sub driving circuits 350 (750) and 360 (760) are controlled, respectively, by the main control signal NCTL_M (PCTL_M) output from the main control circuit 120 (520) and the first and second column block control signals NCTL_CA1 (PCTL_CA1) and NCTL_CA2 (PCTL_CA2) output from the corresponding sub driving circuits.

When a read command READ and a column address are received in Block 1104, the first or second sub driving circuit 350 (750) or 360 (760) located in a non-selected column block is turned off in Block 1105. As a result, the operating voltage is supplied to the bit line sense amplifiers located in a selected column block from which data will be read, by the main driving circuit 330 (730) and the corresponding sub driving circuit 350 (750) or 360 (760). Meanwhile, to the bit line sense amplifiers located in the non-selected column block which will not be accessed, the operating voltage is supplied only by the main driving circuit 330 (730). In other words, the operating voltage applied to the bit line sense amplifiers located in the selected column block from which data will be output is increased, so that the time required to primarily amplify the data voltage of the bit lines is reduced.

Next, it is determined whether the data has been output from the selected column block in Block 1106. If it is determined that the data has not been output yet, the "off" state of the corresponding sub driving circuit in the non-selected column block is maintained. The determination as to whether the data has been output or not is performed by checking whether the second or third control signal CTL2 or CTL3 is disabled.

When the data has been output from the selected column block, the corresponding sub driving circuit in the non-selected column block, which is in the "off" off state, is turned on (Block 1107). As a result, the main driving circuit 330 (730) and the first and second sub driving circuits 350 (750) and 360 (760) in all the column blocks are in the "on" state.

Next, it is determined in Block 1108 whether another read command READ is received. If another read command READ is received, the operations go to Block 1104 to repeat the above-described operations.

If another read command READ is not received, it is determined in Block 1109 whether the sensing-securing delay signal PSDD is disabled. After the sensing-securing delay signal PSDD is disabled, it is determined in Block 1110 whether another read command READ is received. If another read command READ is received in Block 1110 and a column address is received, data is read from a memory cell corresponding to the column address while the first and second sub driving circuits 350 (750) and 360 (760) in all the column blocks are turned on (Block 1111).

If another read command READ is not received in Block 1110, a pre-charge operation is performed to deactivate the bit lines and terminate the overall operation (Block 1112).

Figure 11:
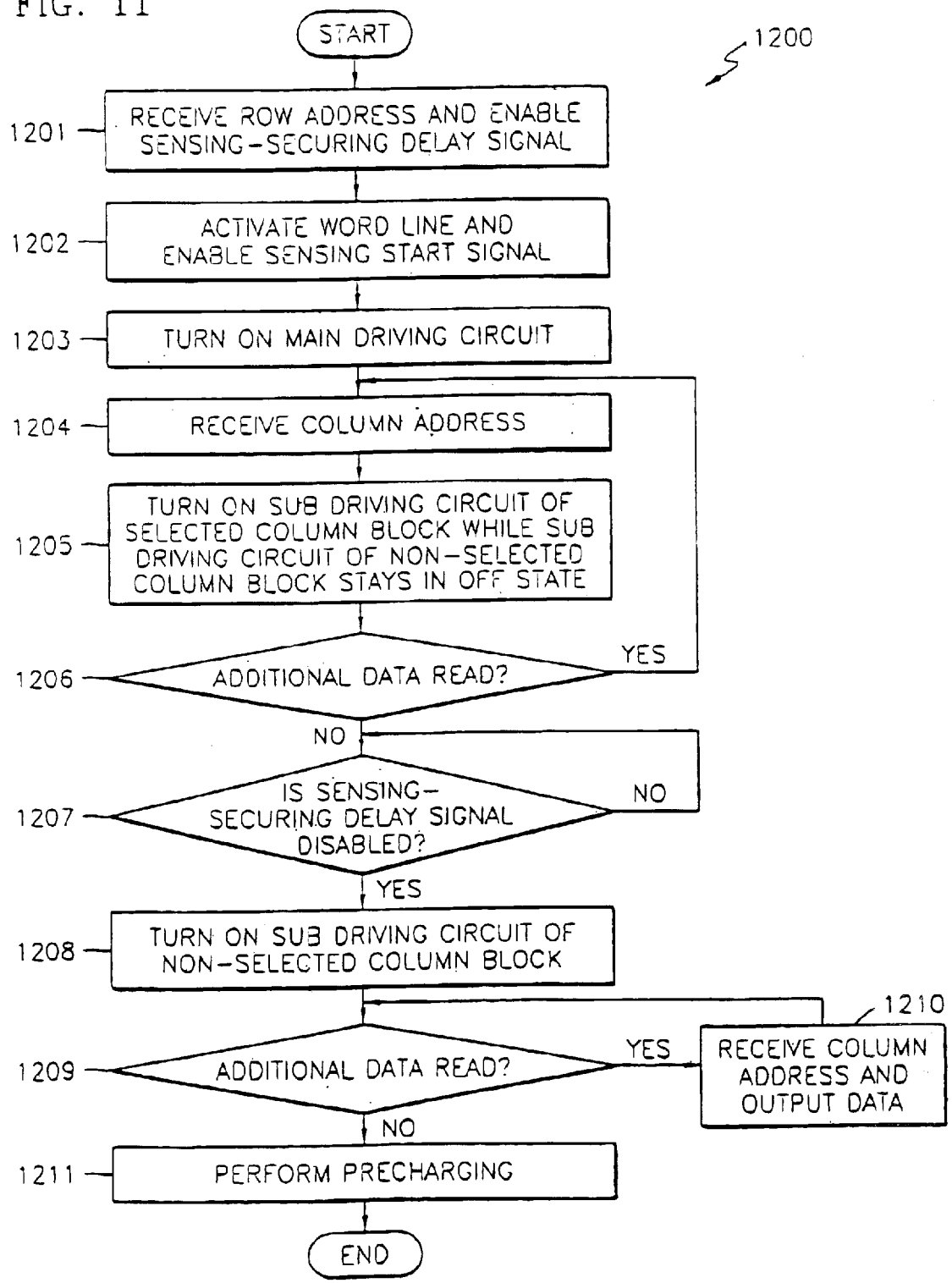
FIG. 11 is a flowchart illustrating operation of a bit line sense amplifier driving control circuits of a synchronous DRAM according to other embodiments of the present invention, which are described above with reference to FIGS. 7 and 9.

FIG. 11 is a flowchart 1200 illustrating operations of bit line sense amplifier driving control circuits that can enable a synchronous DRAM to operate at a higher frequency according to embodiments of the present invention, which are described above with reference to FIGS. 7 and 9.

Referring to FIG. 11, when a control command ACTIVE and a row address are received, the sensing-securing delay signal PSDD is enabled in Block 1201. Then, a corresponding word line is activated, and the bit line sensing start signal SA_SE_ST is enabled in Block 1202. The main driving circuit 330 (730) is turned on (Block 1203). The operation of the main driving circuit 330 (730) is controlled by the main control signal NCTL_M (PCTL_M) output from the main control circuit 820 (920).

When a read command READ and a column address are received in Block 1204, the first or second sub driving circuit 350 (750) or 360 (760) located in a selected column block from which data will be read is selectively turned on, while the other sub driving circuit located in a non-selected column block is maintained in the "off" state (Block 1205). As a result, the operating voltage is supplied to the bit line sense amplifiers located in the selected column block from which data will be read, by the main driving circuit 330 (730) and the corresponding sub driving circuit 350 (750) or 360 (760). Meanwhile, to the bit line sense amplifiers located in the non-selected column block which will not be accessed, the operating voltage is supplied only by the main driving circuit 330 (730).

Next, it is determined in Block 1206 whether another read command READ is received. If another read command READ is received, the process goes to Block 1204 to repeat the above-described operations.

If another read command READ is not received, it is determined in Block 1207 whether the sensing-securing delay signal PSDID is disabled. The sensing-securing delay signal PSDD is a signal providing a minimum amount of time delay required to secure the sensing operation of a bit line sense amplifier.

After the sensing-securing delay signal PSDD is disabled, the corresponding sub driving circuit in the non-selected column block in the "off" state is turned on in Block 1208. As a result, the first and second sub driving circuits 350 (750) and 360 (760) in all the column blocks of the memory cell array are in the "on" state.

Next, it is determined in Block 1209 whether another read command READ is received. If another read command READ is received in Block 1209 and a column address is received, data is read from a memory cell corresponding to the column address (Block 1210).

If another read command READ is not received in Block 1209, a pre-charge operation is performed to deactivate the bit lines and terminate the overall operation (Block 1211).

As described above, in bit line sense amplifier driving control circuits and methods that can enable a synchronous DRAM to operate at a higher frequency according to the present invention, the time required to primarily amplify data voltage of the bit line between a row address input and a column address input can be reduced, so that valid data can be output from a memory cell in a shorter clock cycle. According to embodiments of the present invention, the amount of voltage applied to a selected column block from which data will be read can be increased, so that valid data can be output from the selected column block, quickly and with reduced impact of noise.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A bit line sense amplifier driving control circuit for a synchronous dynamic random access memory having a memory cell array including at least two column blocks divided according to column address and having a plurality of bit line sense amplifiers to sense data that is output from the memory cell array to a bit line, the bit line sense amplifier driving control circuit comprising:

a main control circuit which is responsive to a bit line sense amplifier sensing start signal and a predetermined row block information signal to output a main control signal that controls the sensing operation of the bit line sense amplifiers;

a plurality of sub control circuits which are responsive to a plurality of column block information signals, including first and second column block information signals and a sensing-securing delay signal to output a plurality of sub control signals;

a main driving circuit which drives the bit line sense amplifiers in response to the main control signal; and a plurality of sub driving circuits which drive the bit line sense amplifiers in response to the sub control signals.

2. The bit line sense amplifier driving control circuit of claim 1, wherein the main driving circuit is arranged adjacent all the column blocks of the memory cell array, and a respective sub control circuit is arranged adjacent a respective one of the column blocks.

3. The bit line sense amplifier driving control circuit of claim 1, wherein the at least two column blocks comprise first and second column blocks and wherein the plurality of sub control signals comprise:

a first column block control signal that controls bit line sense amplifiers of the first column block; and a second column block control signal that controls bit line sense amplifiers of the second column block.

4. The bit line sense amplifier driving control circuit of claim 3, wherein the plurality of sub control circuits comprise:

a first sub control circuit which is responsive to the first column block information signal and the sensing-securing delay signal to output the second column block control signal; and a second sub control circuit which is responsive to the second column block information signal and the sensing-securing delay signal to output the first column block control signal.

5. The bit line sense amplifier driving control circuit of claim 4:

wherein the main control circuit comprises a first logic circuit which is responsive to the bit line sense amplifier sensing start signal and the predetermined row block information signal to output a first control signal, and a second logic circuit which is responsive to the first control signal to output the main control signal;

wherein the first sub control circuit comprises a first logic circuit which is responsive to the first column block information signal and the sensing-securing delay signal to output a second control signal, and a second logic circuit which is responsive to the second control signal and the first control signal to output the second column block control signal; and wherein the second sub control circuit comprises a first logic circuit which is responsive to the second column block information signal and the sensing-securing delay signal to output a third control signal, and a second logic circuit which is responsive to the third control signal and the first control signal to output the first column block control signal.

6. The bit line sense amplifier driving control circuit of claim 5, wherein the first column block control signal is disabled when the third control signal is enabled, and the second column block control signal is disabled when the second control signal is enabled.

7. The bit line sense amplifier driving control circuit of claim 6, wherein the second and third control signals are auto pulse signals.

8. The bit line sense amplifier driving control circuit of claim 3, wherein the plurality of sub driving circuits comprises:

a first sub driving circuit which drives the bit line sense amplifiers of the first column block under control of the first column block control signal; and a second sub driving circuit which drives the bit line sense amplifiers of the second column block under control of the second column block control signal.

9. The bit line sense amplifier driving control circuit of claim 8, wherein when one of the first and second column block information signals and the sensing-securing delay signal are enabled, one of the first and second sub driving circuits is turned off while the other sub driving circuit stays in an "on" state.

10. The bit line sense amplifier driving control circuit of claim 8, wherein when the sensing-securing delay signal is enabled, one of the first and second sub driving circuits is turned on while other sub driving circuit stays in an "off" state.

11. The bit line sense amplifier driving control circuit of claim 8:

wherein the first sub driving circuit comprises a plurality of first NMOS transistors, each drain of the first NMOS transistors being connected to a first local array bar line from which a predetermined first operating voltage is supplied to the bit line sense amplifiers arranged in the first column block, each gate of the first NMOS transistors being connected to the first column block control signal and each source of the first NMOS transistors being connected to ground; and wherein the second sub driving circuit comprises a plurality of second NMOS transistors, each drain of the second NMOS transistors being connected a second local array bar line from which the predetermined first operating voltage is applied to the bit line sense amplifiers arranged in the second column block, each gate of the second NMOS transistors being connected to the second column block control signal, and each source of the second NMOS transistors being connected to ground.

12. The bit line sense amplifier driving control circuit of claim 8:

wherein the first sub driving circuit comprises a plurality of first PMOS transistors, each drain of the first PMOS transistors being connected to a first local array line from which a predetermined second operating voltage is supplied to the bit line sense amplifiers arranged in the first column block, each gate of the first PMOS transistors being connected to the first column block control signal, and each source of the first PMOS transistors being connected to an internal voltage, and wherein the second sub driving circuit comprises a plurality of second PMOS transistors, each drain of the second PMOS transistors being connected a second local array line from which the predetermined second operating voltage is applied to the bit line sense amplifiers arranged in the second column block, each gate of the second NMOS transistors being connected to the second column block control signal, and each source of the second PMOS transistors being connected to the internal voltage.

13. A bit line sense amplifier driving control method for a synchronous dynamic random access memory having a memory cell array including at least two column blocks divided according to column address and having a plurality of bit line sense amplifiers to sense data being output from the memory cell array to a bit line, the method comprising:
(a) receiving a row address and enabling a sense-securing delay signal;
(b) activating a word line according to the received row address and enabling a bit line sense amplifier sensing start signal;
(c) turning on a main driving circuit and a plurality of sub driving circuits to supply an operating voltage to the bit line sense amplifiers of all the column blocks;
(d) if a column address is received, turning off a sub driving circuit of a column block which is not selected by the column address, to suspend supplying the operating voltage to the bit line sense amplifiers of the not-selected column block; and
(e) after a predetermined period of time, turning on the sub driving circuit of the not-selected column block which has been turned off in step (d).

14. The method of claim 13, wherein the tuning on the sub driving circuit is followed by:
if an additional column address to read other data from the memory cell array is received, performing steps (d) and (e).

15. The method of claim 13, wherein the predetermined period of time corresponds to a time to output data from a column block selected by the column address.

16. The method of claim 13 wherein the turning on the sub driving circuit is followed by:
if an additional column address to read another data from the memory cell array is received after the sensing-securing delay signal is disabled, maintaining the "on" state of the main driving circuit and all the sub driving circuits.

17. The method of claim 13, wherein the main driving circuit is controlled by a main control signal which is responsive to a bit line sense amplifier sensing start signal and a row block information signal, and the plurality of sub driving circuits are controlled by a plurality of sub control signals, respectively, which are responsive to respective column block information signals and a sensing-securing delay signal.

18. A bit line sense amplifier driving control method for a synchronous dynamic random access memory having a memory cell array including at least two column blocks divided according to column address and having a plurality of bit line sense amplifiers to sense data being output from the memory cell array to a bit line, the method comprising:
(a) receiving a row address and enabling a sense-securing delay signal;
(b) activating a word line according to the received row address and enabling a bit line sense amplifier sensing start signal;
(c) turning on a main driving circuit to supply an operating voltage to the bit line sense amplifiers of all the column blocks; and
(d) if a column address is received, turning on a sub driving circuit of a column block which is selected by the column address to supply the operating voltage to the bit line sense amplifiers of the selected column block while a sub driving circuit of a non-selected column block is maintained in an "off" state.

19. The method of claim 18 wherein the turning on a sub driving circuit is followed by:
if an additional column address to read another data from the memory cell array is received, performing step (d).

20. The method of claim 18, wherein the turning on a sub driving circuit is followed by:
if an additional column address to read another data from the memory cell array is received after the sensing-securing delay signal is disabled, turning on the sub driving circuit in the non-selected column block so that the main driving circuit and the sub driving circuits in all the column blocks are in the "on" state.

21. The method of claim 18, wherein the main driving circuit is controlled by a main control signal which is obtained in response to a bit line sense amplifier sensing start signal and a row block information signal, and the plurality of sub driving circuits are controlled by a plurality of sub control signals, respectively, which are obtained in response to respective column block information signals and a sensing-securing delay signal.

22. A synchronous dynamic random access memory comprising:
a memory cell array including at least a first column block and a second column block that are divided according to column address;
a plurality of first bit line sense amplifiers that are configured to sense data that is output from the first column block of the memory cell array;
a plurality of second bit line sense amplifiers that are configured to sense data that is output from the second column block of the memory cell array; and
a bit line sense amplifier driving control circuit that is responsive to a row address select signal to supply an operating voltage to the first and second bit line sense amplifiers and that is responsive to a column select signal that selects a column address in the first column block, to suspend supplying an operating voltage to the plurality of second bit line sense amplifiers.

23. A synchronous dynamic random access memory according to claim 22 wherein the bit line sense amplifier driving control circuit is further configured to resupply the operating voltage to the plurality of second bit line sense amplifiers a predetermined time after suspending supplying the operating voltage to the plurality of second bit line sense amplifiers.

24. A method of operating a synchronous dynamic random access memory that comprises a memory cell array including at least a first column block and a second column block that are divided according to column address, a plurality of first bit line sense amplifiers that are configured to sense data that is output from the first column block of the memory cell array and a plurality of second bit line sense amplifiers that are configured to sense data that is output from the second column block of the memory cell array, the method comprising:
supplying an operating voltage to the first and second bit line sense amplifiers in response to a row address select signal; and
suspending supplying an operating voltage to the plurality of second bit line sense amplifiers in response to a column select signal that selects a column address in the first column block.

25. A method according to claim 24 further comprising:

resupplying the operating voltage to the plurality of second bit line sense amplifiers a predetermined time after the suspending supplying an operating voltage to the plurality of second bit line sense amplifiers.

26. A synchronous dynamic random access memory comprising:

a memory cell array including at least a first column block and a second column block that are divided according to column address;

a plurality of first bit line sense amplifiers that are configured to sense data that is output from the first column block of the memory cell array;

a plurality of second bit line sense amplifiers that are configured to sense data that is output from the second column block of the memory cell array; and a bit line sense amplifier driving control circuit that is responsive to a row address select signal to increase an operating voltage of the first and second bit line sense amplifiers and that is responsive to a column select signal that selects a column address in the first column block, to reduce the operating voltage of the plurality of second bit line sense amplifiers.

27. A method of operating a synchronous dynamic random access memory that comprises a memory cell array including at least a first column block and a second column block that are divided according to column address, a plurality of first bit line sense amplifiers that are configured to sense data that is output from the first column block of the memory cell array and a plurality of second bit line sense amplifiers that are configured to sense data that is output from the second column block of the memory cell array, the method comprising:

increasing an operating voltage of the first and second bit line sense amplifiers in response to a row address select signal; and reducing the operating voltage of the plurality of second bit line sense amplifiers in response to a column select signal that selects a column address in the first column block.

* * * * *